(12) United States Patent
Lee et al.

(10) Patent No.: US 8,884,416 B2
(45) Date of Patent: Nov. 11, 2014

(54) SEMICONDUCTOR APPARATUS HAVING THROUGH VIAS CONFIGURED TO ISOLATE POWER SUPPLIED TO A MEMORY CHIP FROM DATA SIGNALS SUPPLIED TO THE MEMORY CHIP

(75) Inventors: Go Eun Lee, Gyeonggi-do (KR); Taeje Cho, Yongin-si (KR); Un-Byoung Kang, Hwaseong-si (KR); Seongmin Ryu, Hwaseong-si (KR); Jung-Hwan Kim, Bucheon-si (KR); Tae Hong Min, Gumi-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 627 days.

(21) Appl. No.: 12/960,843

(22) Filed: Dec. 6, 2010

(65) Prior Publication Data

US 2012/0018885 A1    Jan. 26, 2012

(30) Foreign Application Priority Data

Jul. 26, 2010   (KR) .................. 10-2010-0072049

(51) Int. Cl.
*H01L 23/02* (2006.01)
*H01L 23/48* (2006.01)
*H01L 25/065* (2006.01)
*H01L 23/00* (2006.01)
*H01L 23/498* (2006.01)

(52) U.S. Cl.
CPC .......... *H01L 23/481* (2013.01); *H01L 25/0657* (2013.01); *H01L 24/73* (2013.01); *H01L 23/49816* (2013.01); *H01L 23/49855* (2013.01); *H01L 2225/06541* (2013.01); *H01L 24/48* (2013.01); *H01L 2224/16145* (2013.01); *H01L 2224/16146* (2013.01); *H01L 2224/16225* (2013.01); *H01L 2224/16227* (2013.01); *H01L 2224/32145* (2013.01); *H01L 2224/48145* (2013.01); *H01L 2224/48227* (2013.01); *H01L 2224/73207* (2013.01); *H01L 2224/73253* (2013.01); *H01L 2224/73257* (2013.01); *H01L 2224/73265* (2013.01); *H01L 2924/1431* (2013.01); *H01L 2924/1434* (2013.01); *H01L 2924/15311* (2013.01); *H01L 2924/01322* (2013.01); *H01L 2924/10253* (2013.01)
USPC ........................ 257/686; 257/276; 257/777

(58) Field of Classification Search
USPC .......................................... 257/276, 686, 777
See application file for complete search history.

(56) References Cited

U.S. PATENT DOCUMENTS 7,535,110 B2    5/2009  Wu et al.
7,741,723 B2 *  6/2010  Uchida .................. 257/777

(Continued)

FOREIGN PATENT DOCUMENTS

JP    2008-010759    1/2008
KR    10-0893310    4/2009

*Primary Examiner* — James Mitchell
(74) *Attorney, Agent, or Firm* — Harness, Dickey & Pierce

(57) ABSTRACT

A semiconductor apparatus includes a base substrate and a logic chip disposed on the base substrate. The logic chip includes a memory control circuit, a first through silicon via, and a second through silicon via. The memory control circuit is disposed on a first surface of a substrate of the logic chip, and a memory chip is disposed on a second surface of the substrate of the logic chip. The first through silicon via electrically connects the memory control circuit and the memory chip, the second through silicon via is electrically connected to the memory chip and is configured to transmit power for the memory chip, the second through silicon via is electrically insulated from the logic chip, and the first surface of the substrate of the logic chip faces the base substrate.

26 Claims, 23 Drawing Sheets

(56) References Cited

U.S. PATENT DOCUMENTS

| | | | |
|---|---|---|---|
| 7,851,898 B2* | 12/2010 | Nakamura et al. | 257/685 |
| 8,115,292 B2* | 2/2012 | Toh et al. | 257/686 |
| 2006/0227587 A1* | 10/2006 | Nakamura et al. | 365/63 |
| 2006/0231928 A1* | 10/2006 | Dotta et al. | 257/621 |
| 2008/0001305 A1* | 1/2008 | Uchida | 257/777 |
| 2008/0006948 A1 | 1/2008 | Wu et al. | |
| 2008/0272465 A1 | 11/2008 | Do et al. | |
| 2009/0166834 A1* | 7/2009 | Yoon et al. | 257/686 |
| 2009/0261457 A1* | 10/2009 | Pratt | 257/621 |
| 2009/0278244 A1* | 11/2009 | Dunne et al. | 257/676 |
| 2010/0102428 A1* | 4/2010 | Lee et al. | 257/686 |
| 2011/0050320 A1* | 3/2011 | Gillingham | 327/365 |
| 2011/0156232 A1* | 6/2011 | Youn et al. | 257/686 |
| 2011/0193212 A1* | 8/2011 | Gu et al. | 257/686 |
| 2011/0204505 A1* | 8/2011 | Pagaila et al. | 257/686 |
| 2011/0246746 A1* | 10/2011 | Keeth et al. | 712/29 |
| 2012/0126419 A1* | 5/2012 | Kripesh et al. | 257/774 |

* cited by examiner

1900

SEMICONDUCTOR APPARATUS HAVING THROUGH VIAS CONFIGURED TO ISOLATE POWER SUPPLIED TO A MEMORY CHIP FROM DATA SIGNALS SUPPLIED TO THE MEMORY CHIP

CROSS-REFERENCE TO RELATED APPLICATION

This application claims priority to Korean Patent Application No. 10-2010-0072049, filed on Jul. 26, 2010, the entire contents of which are hereby incorporated by reference.

BACKGROUND

1. Technical Field

The present disclosure relates to a semiconductor apparatus, and more particularly, to a semiconductor apparatus having through silicon vias.

2. Related Art

A through-silicon via (TSV) is a vertical electrical connection (via) passing through a silicon wafer or die. TSVs can be used to connect multiple chips (integrated circuits) together in a package. A 3D package may contain two or more chips stacked vertically using the TSVs so that the chips occupy less space.

SUMMARY

According to an exemplary embodiment, a logic chip includes a memory control circuit, a first through via (or, first through silicon via) electrically connected to the memory control circuit, and a second through via electrically insulated from the memory control circuit. The embodiment also includes a memory chip stacked over the logic chip. The first through via is disposed between the memory control circuit and the memory chip to connect the memory control circuit to the memory chip.

The second through via may be electrically insulated from the logic chip, and may be electrically connected to the memory chip to deliver power to the memory chip.

The first through via may deliver one of a data signal, a control signal, and an address signal from the memory control circuit to the memory chip.

The logic chip may further include a micro input/output circuit connecting the memory control circuit to the first through via.

The micro input/output circuit may include a plurality of transmission channels, and at least one of the plurality of transmission channels may be electrically connected to the first through via.

The semiconductor apparatus may further include a plurality of conductive bumps disposed between the logic chip and the memory chip and aligned with the first through via and the second through via, respectively.

The logic chip may include a first surface on which the memory control circuit is disposed and a second surface opposite to the first surface, and may further include a first wiring pattern connected to the first through via and/or the second through via.

The semiconductor apparatus may further include a package substrate (or, a base substrate), wherein the logic chip may be flip-chip bonded on the package substrate such that the memory control circuit faces the package substrate.

The logic chip may include two or more first through vias electrically connected to each other and delivering the same signal.

The logic chip may include two or more second through vias electrically connected to each other and delivering the same power voltage.

The logic chip may include an external input/output circuit connected to the memory control circuit.

According to an exemplary embodiment, semiconductor apparatuses include a package substrate, and a semiconductor chip flip-chip bonded to the package substrate. The semiconductor chip includes a memory control circuit disposed on a surface of the semiconductor chip facing the package substrate, a chip pad disposed on the surface and insulated from the memory control circuit, a signal through via having one end thereof connected to the memory control circuit and the other end thereof extending to another surface opposite to the surface, and a power through via having one end thereof connected to the chip pad and the other end thereof extending to the other surface.

The semiconductor apparatus may further include an internal wiring pattern connecting the chip pad to the power through via.

The semiconductor apparatus may further include a memory chip stacked over the other surface of the semiconductor chip and electrically connected to the signal through via and the power through via.

A signal for operating the memory chip may be delivered from the memory control circuit to the memory chip through the first through via.

Power for operating the memory chip may be delivered from the package substrate to the memory chip through the chip pad and the second through via.

According to an exemplary embodiment, semiconductor apparatuses include a package substrate; a logic chip mounted in the package substrate and including a first memory control circuit, a first through via electrically connected to the first memory control circuit to deliver a signal generated in the first memory control circuit, and a second through via electrically insulated from the first memory control circuit; a first memory chip stacked over the logic chip, and a second memory chip stacked over the first memory chip.

The logic chip may further include a second memory control circuit, a third through via electrically connected to the second memory control circuit, and a fourth through via electrically insulated from the first and second memory control circuits.

The semiconductor apparatus may further include a bonding wire connecting the logic chip to the second memory chip.

The bonding wire may be electrically connected to the third through via, and a signal for operating the second memory chip may be delivered from the second memory control circuit to the second memory chip through the third through via and the bonding wire.

The bonding wire may be electrically connected to the fourth through via, and a signal and/or power for operating the second memory chip may be delivered from the package substrate to the second memory chip through the fourth through via and the bonding wire.

The bonding wire may include a first bonding wire electrically connected to the third through via and a second bonding wire electrically connected to the fourth through via, and a signal for operating the second memory chip may be delivered from the second memory control circuit to the second memory chip through the third through via and the first bonding wire and power for operating the second memory chip may be delivered form the package substrate to the second memory chip through the fourth through via and the second bonding wire.

A signal and power for operating the first memory chip may be delivered to the first memory chip through the first through via and the second through via, respectively, and a signal and power for operating the second memory chip may be delivered to the second memory chip through the third through via and the fourth through via.

The semiconductor may further include a fifth through via penetrating at least a portion of the first memory chip.

The fifth through via may be electrically connected to the first through via, and a signal for operating the second memory chip may be delivered from the first memory control circuit to the second memory chip through the first through via and the fifth through via.

The fifth through via may be electrically connected to the second through via, and a signal and/or power for operating the second memory chip may be delivered from the package substrate to the second memory chip through the second through via and the fifth through via.

The semiconductor apparatus may further include a signal through via and a power through via that penetrate at least a portion of the first memory chip, wherein a signal for operating the second memory chip may be delivered to the second memory chip through the first through via and the signal through via, and power for operating the second memory chip is delivered to the second memory chip through the second through via and the power through via.

BRIEF DESCRIPTION OF THE DRAWINGS

Exemplary embodiments of the present invention can be understood in more detail from the following descriptions taken in conjunction with the accompanying drawings, in which.

DETAILED DESCRIPTION OF EXEMPLARY EMBODIMENTS

Figure 1:
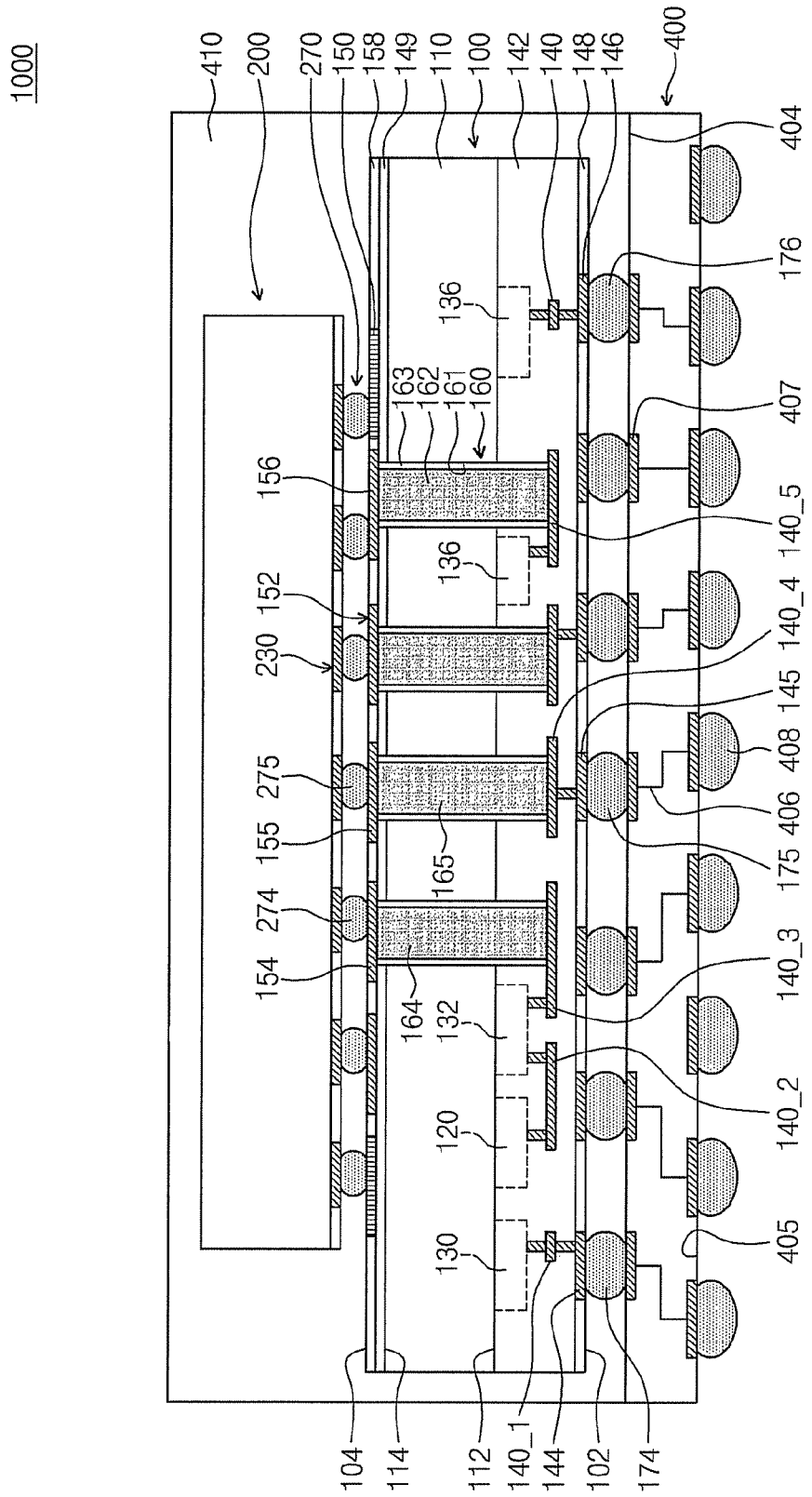
FIG. 1 is a cross-sectional view illustrating a semiconductor apparatus according to an embodiment of the inventive concepts.

The present invention now will be described more fully hereinafter with reference to the accompanying drawings, in which embodiments of the invention are shown. This invention may, however, be embodied in many different fauns and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a cross-sectional view illustrating a semiconductor apparatus 1000 according to an embodiment of the inventive concepts. Referring to FIG. 1, the semiconductor apparatus 1000 may include a logic chip 100. The logic chip 100 may include a first surface 102 and a second surface 104 opposite to the first surface 102. For example, the first surface 102 may be an active surface on which a circuit unit is disposed. A memory chip 200 including a memory circuit may be stacked over the second surface 104 of the logic chip 100. The memory circuit may include a memory cell region storing data and/or a memory logic region for operating the memory chip 200.

The logic chip 100 may include a semiconductor substrate 110 and a circuit unit disposed on the semiconductor substrate 110. The semiconductor substrate 110 may include a first surface 112 and a second surface 114 opposite to the first surface 112. The circuit unit may be disposed on the first surface 112. The circuit unit may include function circuits 120, 130, 132 and 136, a first internal wiring 140 connected to the function circuits 120, 130, 132 and 136, and an interlayer dielectric 142 covering the first internal wiring 140.

The function circuits 120, 130, 132 and 136 may include integrated circuits. The function circuits 120, 130, 132 and 136 may include passive elements such as transistors, resistors, and capacitors. The function circuits 120, 130, 132 and 136 may include a memory control circuit 120, an external input/output circuit 130, a micro input/output circuit 132, and/or an additional function circuit 136. The memory control circuit 120 may supply a data signal and/or a memory control signal for operating the memory chip 200. For example, the memory control signal may include an address signal, a command signal, or a clock signal. The external input/output circuit 130 may receive a data signal from the outside of the logic chip 100 to transmit the received data signal to the memory control circuit 120, or may receive a data signal from the memory control circuit 120 to transmit the received data signal to the outside of the logic chip 100. The micro input/output circuit 132 may receive and send a data signal from and/or to the memory control circuit 120, or may receive a memory control signal from the memory control circuit 120. The additional function circuit 136 may be a circuit performing a function other than memory controlling or external inputting/outputting. For example, when the logic chip 100 is a System-on-Chip (SoC), the additional function circuit 136 may be a power branch circuit, an RF circuit, an external interface circuit, or a control circuit for other components.

The first internal wiring 140 may include at least one or more layers of wiring pattern and a contact plug perpendicularly connected to the wiring pattern. The first internal wiring 140 may be connected to each other, or may include insulated internal wiring patterns 140_1, 140_2, 140_3, 140_4 and 140_5. A portion of the first internal wiring 140 may be connected to at least one of the function circuits 120, 130, 132 and 136, or may be connected between the function circuits 120, 130, 132 and 136.

The logic chip 100 may include logic chip pads 144, 145 and 146 disposed at the first surface 102. At least a portion of the logic chip pads 144, 145 and 146 may be connected to a portion of the first internal wiring 140. A passivation layer 148 may be formed to expose at least a portion of the logic chip pads 144, 145 and 146. The passivation layer 148 may be formed on the interlayer dielectric 142 while exposing at least a portion of the logic chip pads 144, 145 and 146. The passivation layer 148 may protect the circuit unit in the logic chip 100 from external humidity.

At least a portion of the function circuits 120, 130, 132 and 136 may be connected to the first internal wiring 140, or may be connected to at least one of the logic chip pads 144, 145 and 146 through the first internal wiring 140. For example, the first internal wiring pattern 140_1 of the first internal wiring 140 may electrically connect the external input/output circuit 130 and the logic chip pad 144. The second internal wiring pattern 140_2 may electrically connect the memory control circuit 120 and the micro input/output circuit 132. The third internal wiring pattern 140_3 may electrically connect the micro input/output circuit 132 and a first through via 164. The fourth internal wiring pattern 140_4 may be insulated from other internal wiring patterns and electrically connect the second through via 165 and the logic chip pad 145. The fifth internal wiring pattern 140_5 may be electrically connected to the additional function circuit 136.

An insulation layer 149 may be provided on the second surface 114. The insulation layer 149 may include, for example, a silicon oxide layer, a silicon nitride layer, or a silicon oxynitride layer. The insulation layer 149 may prevent the semiconductor substrate 110 from being contaminated by conductive materials used in a subsequent process.

A first wiring pattern 150 may be disposed on the insulating layer 149. The first wiring pattern 150 may be a rewiring pattern. The first wiring pattern 150 may be connected to a connection pad 152 disposed at the second surface 104 of the logic chip 100. The connection pad 152 may be connected to a conductive member 270 of the memory chip 200 stacked over the logic chip 100. A passivation layer 158 may be disposed on the insulating layer to expose at least a portion of the connection pad 152. The connection pad 152 may include a plurality of connection pads 154, 155 and 156 that are insulated from each other.

The logic chip 100 may include a through via 160 that penetrates at least a portion of the logic chip 100. The through via 160 may include a conductive connection 162 that fills at least a portion of the via hole 161 penetrating the semiconductor substrate 110. A via insulation layer 163 may be disposed between the semiconductor substrate 110 exposed by the via hole 161 and the conductive connection 162. One end of the through via 160 may be directly connected to the first internal wiring 140, and the other end of the through via 160 may be directly connected to the connection pads 154, 155 and 156.

The logic chip 100 may include a plurality of through vias 160. The through vias 160 may be a transmission path of signal or power for operating the memory chip 200. The signal may include a data signal and a control signal. The power may include a power voltage (VDD) and a ground voltage (VSS). The plurality of through vias 160 may include a first through via 164 and a second through via 165. The first through via 164 may be connected to at least one of the function circuits 120, 130, 132 and 136. For example, one end of the first through via 164 may be connected to at least one of the function circuits 120, 130, 132 and 136, and the other end thereof may be connected to at least one of the connection pads 154 and 156. For example, the first through via 164 may be connected to the memory control circuit 120 to provide a signal transmission path between the logic chip 100 and the memory chip 200. Accordingly, the first through via 164 may provide an interface path between the logic chip 100 and the memory chip 200 regardless of a signal transmission from the outside. According to an embodiment, a data signal and/or a control signal may be transmitted from the memory control circuit 120 to the memory chip 200 through the first through via 164 without being affected by the speed of a signal transmission from the outside in a communication between the logic chip 100 and the memory chip 200. The first through via 164 may be connected to at least one of the function circuits 120, 130, 132 and 136 through the second internal wiring pattern 140_2 and the third internal wiring pattern 140_3.

The second through via 165 may be insulated from the function circuits 120, 130, 132 and 136. That is, the second through via 165 may provide an electrical path insulated from the logic chip 100. The second through via 165 may provide an electrical path insulated from the logic chip 100 through the fourth internal wiring pattern 140_4 electrically insulated from other internal wiring patterns. An electrical signal path from the logic chip pad 145 to the connection pad 155 may be provided. For example, one end of the second through via 165 may be connected to the logic chip pad 145, and the other end thereof may be connected to the connection pad 155. For example, the second through via 165 may be a power transmission path of the memory chip 200. The second through via 165 electrically penetrates the logic chip 100. Accordingly, when the memory chip 200 uses a power of a different voltage level from the logic chip 100, a power may be supplied to the memory chip 200 separately from the power of the logic chip. According to an embodiment, even when the memory chip 200 uses a power of a same voltage level as the logic chip 100, the power for operating the memory chip 200 may be supplied to the memory chip 200 separately from the logic chip 100 to reduce a noise. The second through via 165 may be connected to the logic chip pad 145 through the fourth internal wiring pattern 140_4. The second through via 165 may be formed by substantially a same process as the first through via 164 to have substantially a same diameter as the first through via 164. Alternatively, the second through via 165 may be formed to have a diameter greater than that of the first through via 164. According to an embodiment of the inventive concepts, the resistance of the power transmission path can reduced.

The logic chip 100 and the memory chip 200 may be mounted on a package substrate (or, a base substrate) 400. The package substrate 400 may include a first surface 404 and a second surface 405 opposite to the first surface 404. The package substrate 400 may be a Printed Circuit Board (PCB) including a circuit pattern 406. The package substrate 400 may include a chip bonding pad 407 disposed at the first surface 404, and a conductive member 408 disposed at the second surface 405. The conductive member 408 may be a ball grid array including, for example, a solder ball. The chip bonding pad 407 and the conductive member 408 may be electrically connected to each other by the circuit pattern 406. When the logic chip 100 is a wafer level package, the package substrate 400 may be a module board.

The logic chip 100 may be mounted on the package substrate 400 by a flip-chip bonding method in which an active surface faces a substrate according to an embodiment of the inventive concepts. For example, the logic chip 100 may be mounted such that the first surface 102 of the logic chip 100 faces the first surface 404 of the package substrate 400, and a connection member may be connected to the chip bonding pad 407. The connection member may be divided into a signal connection member 174 electrically connected to the first through via 164, a power connection member 175 electrically connected to the second through via 165, and an additional connection member 176. Since the logic chip 100 comprises a face down structure, i.e., the active surface of the logic chip 100 faces the base substrate 400, a signal path is shorter as compared to a face up structure. Accordingly, a high-speed operation is possible between the package substrate 400 and the function circuits 130 and 136.

The semiconductor apparatus 1000 may include a molding 410 covering at least a portion of the logic chip 100 and the package substrate 400. The molding 410 may include underfill material, and may be formed between the logic chip 100 and the package substrate 400 or between the logic chip 100 and the memory chip 200. According to an embodiment, the molding 410 may include epoxy molding compound, and may cover the first surface 404 of the package substrate 400, the logic chip 100, and the memory chip 200.

Figure 2:
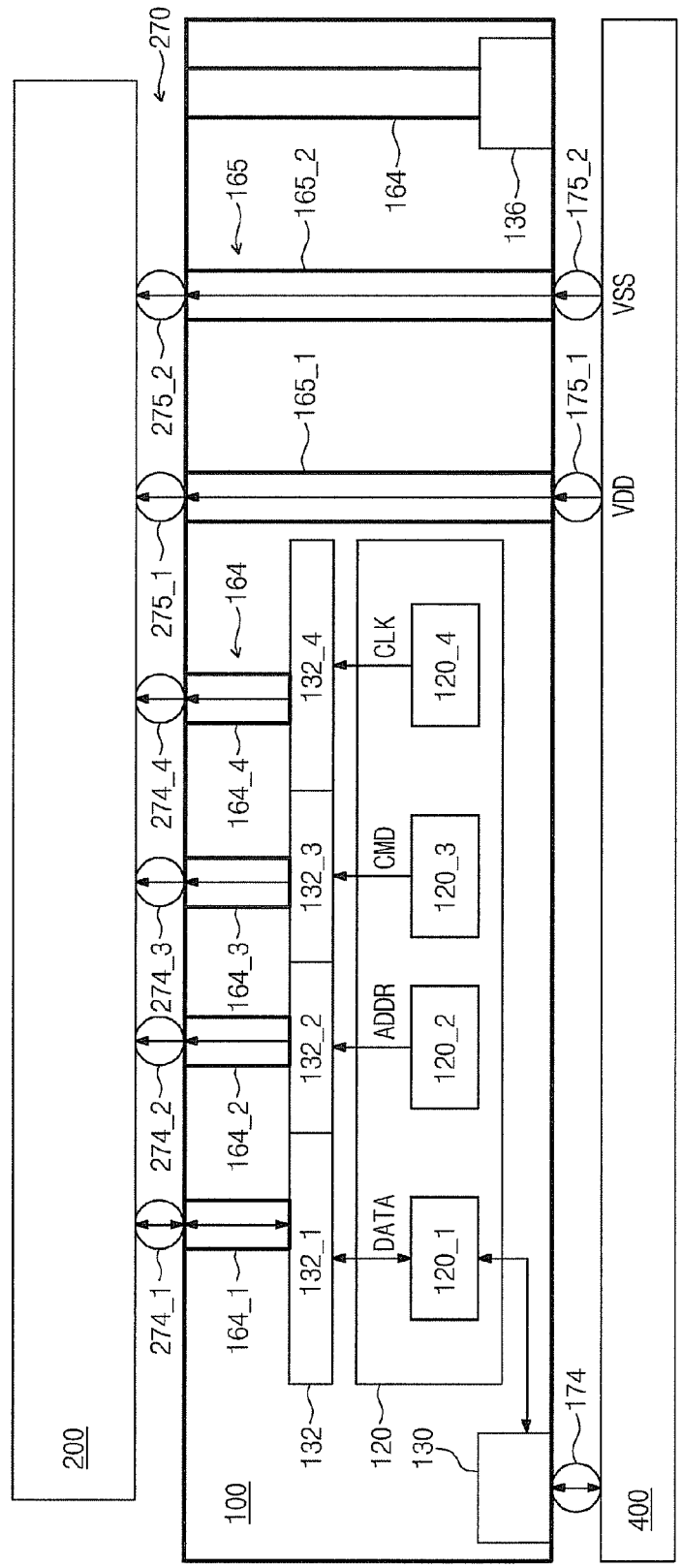
FIG. 2 is a block diagram illustrating signal and power delivery paths according to an embodiment of the inventive concepts.

FIG. 2 is a block diagram illustrating signal and power transmission paths according to an embodiment of the inventive concepts.

Referring to FIGS. 1 and 2, an external signal and power may be supplied from the package substrate 400 to the logic chip 100 or the memory chip 200. The external signal may be supplied to the external input/output circuit 130 in the logic chip 100 through the signal connection member 174 of the logic chip 100. For example, the external signal may include data to be stored in a memory circuit. The data to be stored in the memory circuit may be inputted into the memory circuit through the external input/output circuit 130, and data read from the memory circuit may be outputted through the external input/output circuit 130.

A signal for operating the memory chip 200 may be generated in the memory control circuit 120 and may be transmitted to the memory chip 200 through the micro input/output circuit 132, the first through via 164, and the signal conductive member 274 of the memory chip 200. That is, the first through via 164 may be used to interface between the memory control circuit 120 and the memory chip 200. The signal for operating the memory chip 200 may include a data signal DATA and a control signal. The control signal may include an address signal ADDR, a command signal CMD, and a clock signal CLK.

The memory control circuit 120 may include a data circuit 120_1, an address circuit 120_2, a command circuit 120_3, and/or a clock circuit 120_4. The data circuit 120_1, the address circuit 120_2, the command circuit 120_3, and the clock circuit 120_4 may generate a data signal DATA, an address signal ADDR, a command signal CMD, and a clock signal CLK, respectively. The data signal DATA, the address signal ADDR, the command signal CMD, and the clock signal CLK may be delivered to a data signal transmission channel 132_1, an address signal transmission channel 132_2, a command signal transmission channel 132_3, and a clock signal transmission channel 132_4 of the micro input/output circuit 132, respectively.

The signals DATA, ADDR, CMD and CLK may be delivered to the transmission channels 132_1, 132_2, 132_3 and 132_4 of the micro input/output circuit 132 through a portion of the first internal wirings 140 that are insulated from each other. The data signal transmission channel 132_1, the address signal transmission channel 132_2, the command signal transmission channel 132_3, and the clock signal transmission channel 132_4 of the micro input/output circuit 132 may be connected to a data signal through via 164_1, an address signal through via 164_2, a command signal through via 164_3, and a clock signal through via 164_4, respectively. The data signal through via 164_1, the address signal through via 164_2, the command signal through via 164_3, and the clock signal through via 164_4 may be connected to a data signal conductive member 274_1, an address signal conductive member 274_1, a command signal conductive member 274_3, and a clock signal conductive member 274_4, respectively. That is, the data signal DATA may be generated in the data circuit 120_1 using an external data signal transmitted from the external input/output circuit 130, and may be inputted into the memory chip 200 through the data signal transmission channel 132_1, the data signal through via 164_1, and the data signal conductive member 274_1.

When the data signal DATA is outputted from the memory chip 200, the data signal DATA may transmit along the opposite route, that is, through the data signal conductive member 274_1, the data signal through via 164_1, the data signal transmission channel 132_1, and the signal connection member 174. The address signal ADDR, the command signal CMD, and the clock signal CLK may be generated in the memory control circuit 120 without an external input signal, and may be supplied to the memory chip 200. Accordingly, the data circuit 120_1 may include a transmitter and a receiver for two-way communication. The address circuit 120_2, the command circuit 120_3, and the clock circuit 120_4 may include a transmitter.

A power for operating the memory chip 200 may be supplied to the package substrate 400 and transmitted to the inside of the memory chip 200 through the power connection member 174, the second through via 165, and the power conductive member 275. That is, the second through via 165 may be used to supply a power from the outside to the memory chip 200. The second through via 165 may include a plurality of second through vias 165_1 and 165_2 electrically insulated from each other. The power may include a power voltage VDD and a ground voltage VSS.

For example, the power voltage VDD and the ground voltage VSS for operating the memory chip 200 may be supplied from the package substrate 400 to the memory chip 200 through the power voltage through via 165_1 and the ground voltage through via 165_2, respectively. The power voltage VDD may be supplied to the memory chip 200 through a power voltage connection member 175_1, the power voltage through via 165_1, and a power voltage conductive member 275_1. The ground voltage VSS may be supplied to the memory chip 200 through a ground voltage connection member 175_2, the ground voltage through via 165_2, and a power voltage conductive member 275_2.

According to an embodiment, when different power voltage levels are used for operating the memory chip 200, the power may be separated according to the voltage level to be supplied to the package substrate 400, or may be supplied to the package substrate 400 at one voltage level, and then branched into each voltage level in the logic chip 100 or the memory chip 200. For example, when the power is separately supplied according to a voltage level, each power may be supplied to the memory chip 200 through the plurality of second through vias 165_1 and 165_2 electrically insulated from each other. When the power is branched in the power branch circuit 136 of the logic chip 100, the voltage level for operating the memory chip 200 may be supplied to the memory chip 200 through the first through via 164 connected to the power branch circuit 136.

According to an embodiment of the inventive concepts, paths of signal and power delivered to the memory chip 200 may be independent of each other. For example, the signal may be delivered from the memory control circuit 120 inside the logic chip 100 to the memory chip 200 through the first through via 164, and the power may be delivered from the outside to the memory chip 200 through the second through via 165.

Figure 3:
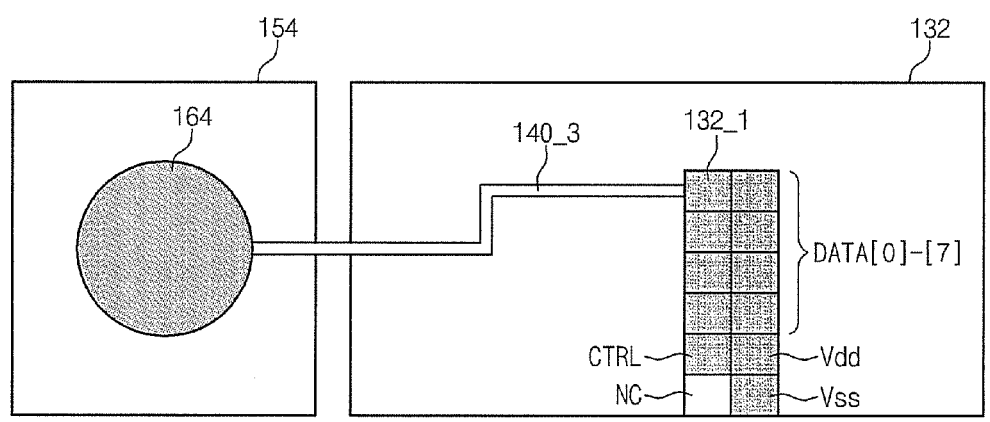
FIG. 3 is a diagram illustrating a connection relation between a micro I/O circuit and a first through via in a semiconductor apparatus according to an embodiment of the inventive concepts.

FIG. 3 is a diagram illustrating a connection relation between a micro I/O circuit and a first through via in a semiconductor apparatus according to an embodiment of the inventive concepts. Referring to FIGS. 2 and 3, the micro input/output circuit 132 may include a plurality of transmission channels. The respective channels may be insulated from each other, and may be connected to the plurality of first through vias, respectively. For example, when the memory chip 200 operates by a unit of 8-bit, data signal DATA [0]-[7], control signal CTRL, power voltage VDD, and ground voltage VSS transmission channels may be grouped. The data signal transmission channel 132_1 for transmission of the data [0] may be connected to the first through via 164 through a portion of the first internal wiring 140_3. In this case, the first through via 164 may be a signal transmission through via 164_1. The first through via 164 may be connected to the memory chip 200 through the connection pad 154. The other transmission channels may be connected to the other first through vias, respectively. The micro input/output circuit 132 may further include a transmission channel NC that is not connected to the first through via.

Figure 4A:
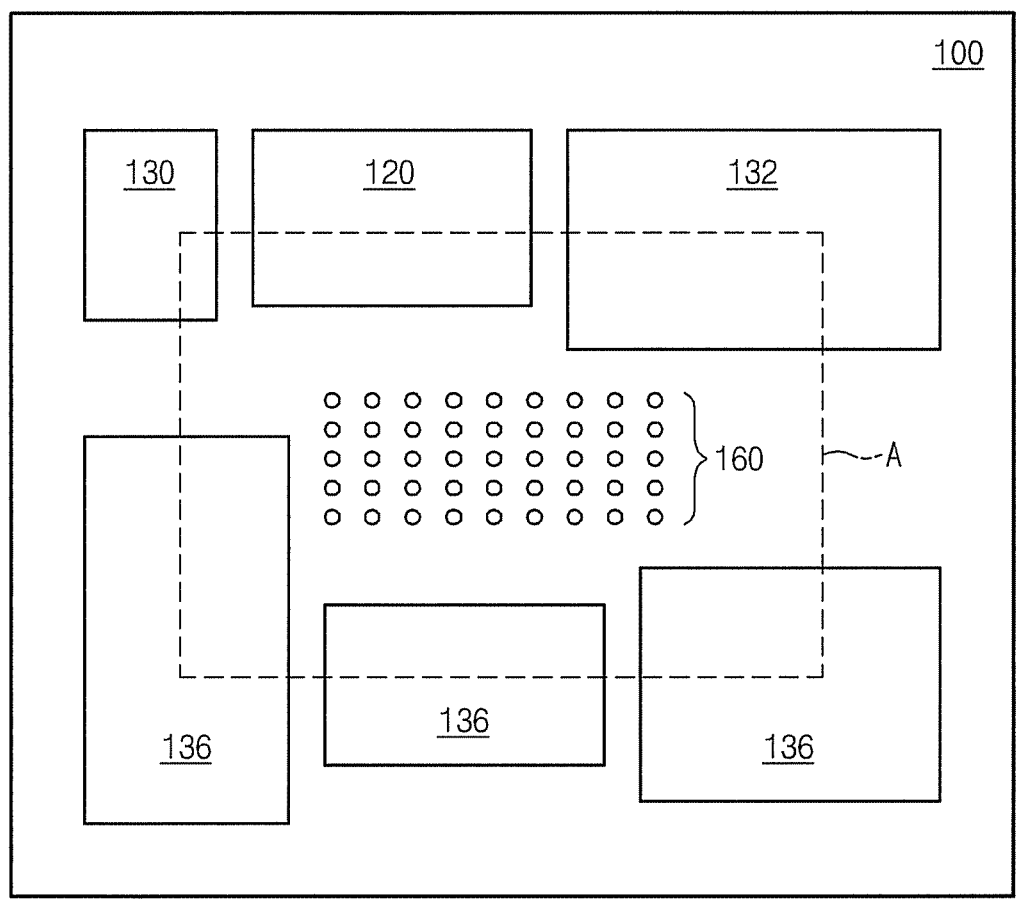
FIGS. 4A through 4C are diagrams illustrating a logic chip disposed in a semiconductor apparatus according to an embodiment of the inventive concepts.
Figure 4B:
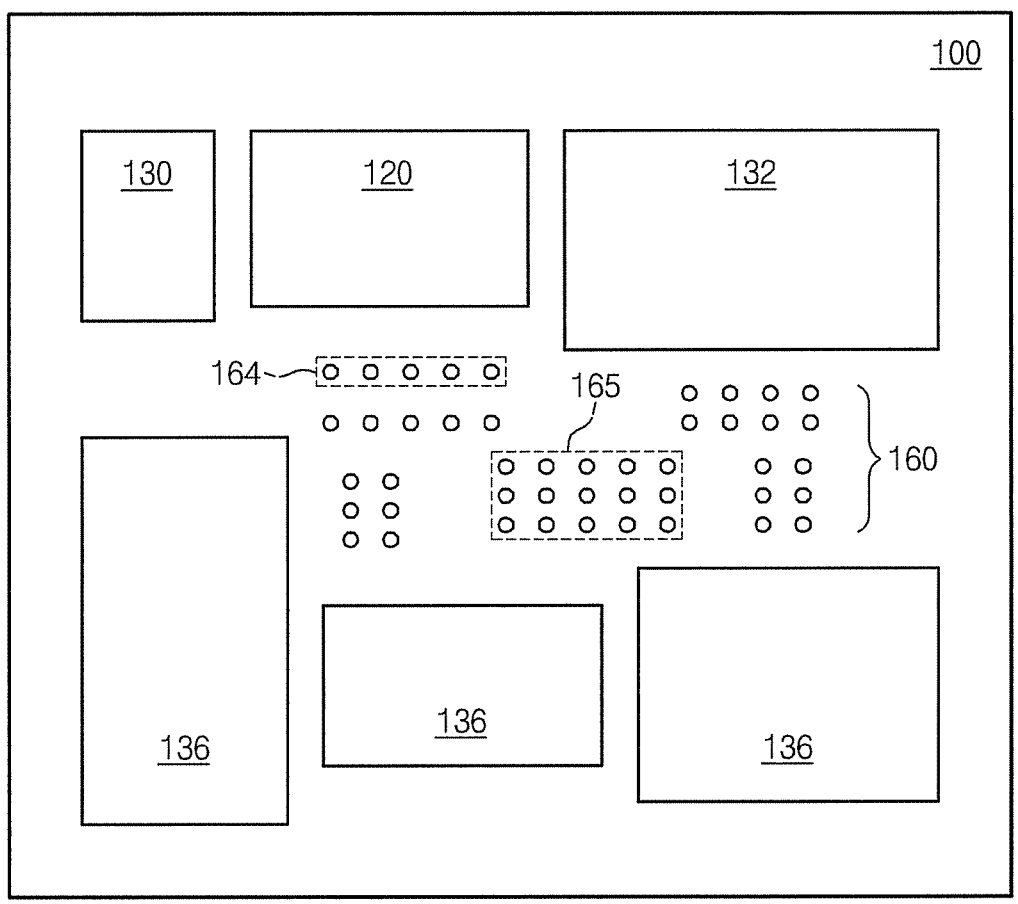
Figure 4C:
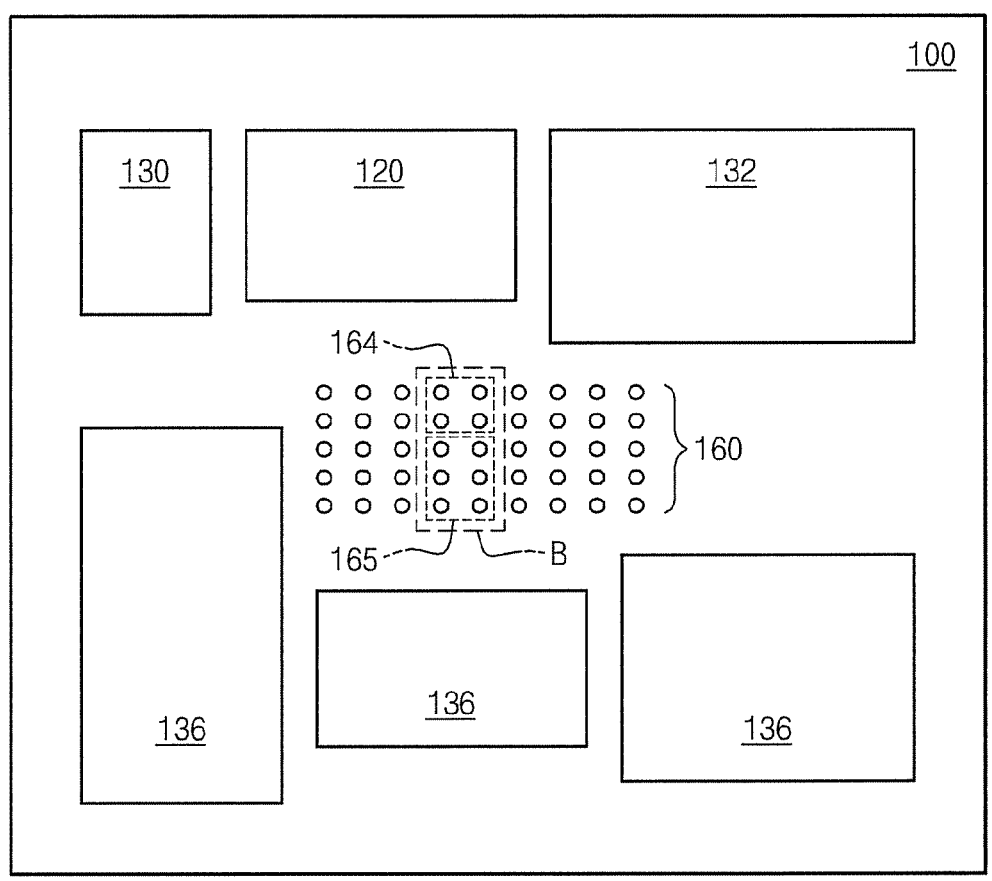

FIGS. 4A through 4C are diagrams illustrating a logic chip 100 in a semiconductor apparatus according to an embodiment of the inventive concepts. Referring to FIGS. 1 and 4A, the through vias 160 may be disposed in a region where the function circuits 120, 130, 132 and 136 inside the logic chip 100 are not formed. In an embodiment, the function circuits 120, 130, 132 and 136 do not overlap the through vias 160. The disposition of the through vias 160 may be determined in consideration of the disposition of the memory chip 200 stacked over the logic chip 100. For example, when the memory chip 200 is smaller than the logic chip 100, the through vias 160 may be formed in the central region A of the logic chip 100. The central region A may be a region vertically corresponding to the memory chip 200 stacked over the logic chip 100.

According to an embodiment, the through vias 160 may be distributed throughout the logic chip 100, or may be disposed only in a certain region of the logic chip 100. The disposition of the through vias 160 may be determined in consideration of the disposition of the conductive members 270 of the memory chip 200. For example, a distance between the through vias 160 may be equal to a distance between the conductive members 270 of the memory chip 200. Accordingly, the through vias 160 and the connection pads 152 may be distant from each other or connected to each other through the first wiring pattern 150. That is, the first wiring pattern 150 may serve as a rewiring between the through vias 160 and the connection pads 152. The through vias 160 may be connected to the conductive members 270 through the connection pads 152, respectively.

According to an embodiment, the through vias 160 may be disposed in consideration of a connection relation with the function circuits 120, 130, 132 and 136 or signal and/or power delivered through the through vias 160. For example, the through vias 160 that deliver a same kind of signals or a same level of voltage may be grouped respectively. Referring to FIG. 4B, the first through vias 164 that deliver a data signal or a memory control signal may be grouped to be disposed adjacent to the memory control circuit 120, respectively. The second through vias 165 that deliver power for operating the memory chip 200 may be grouped to be disposed spaced apart from the function circuits 120, 130, 132 and 136, respectively.

According to an embodiment, the through vias 160 that deliver signal and power for operating a memory circuit may be grouped to be disposed near each memory circuit. Referring to FIG. 4C, the first and second through vias 164 and 165 that deliver a data signal, a control signal, a power voltage VDD, and a ground voltage VSS to a specific memory circuit may be grouped to be disposed in a region B in a vertical alignment with a portion of the conductive members 270 connected to the specific memory circuit.

Figure 5:
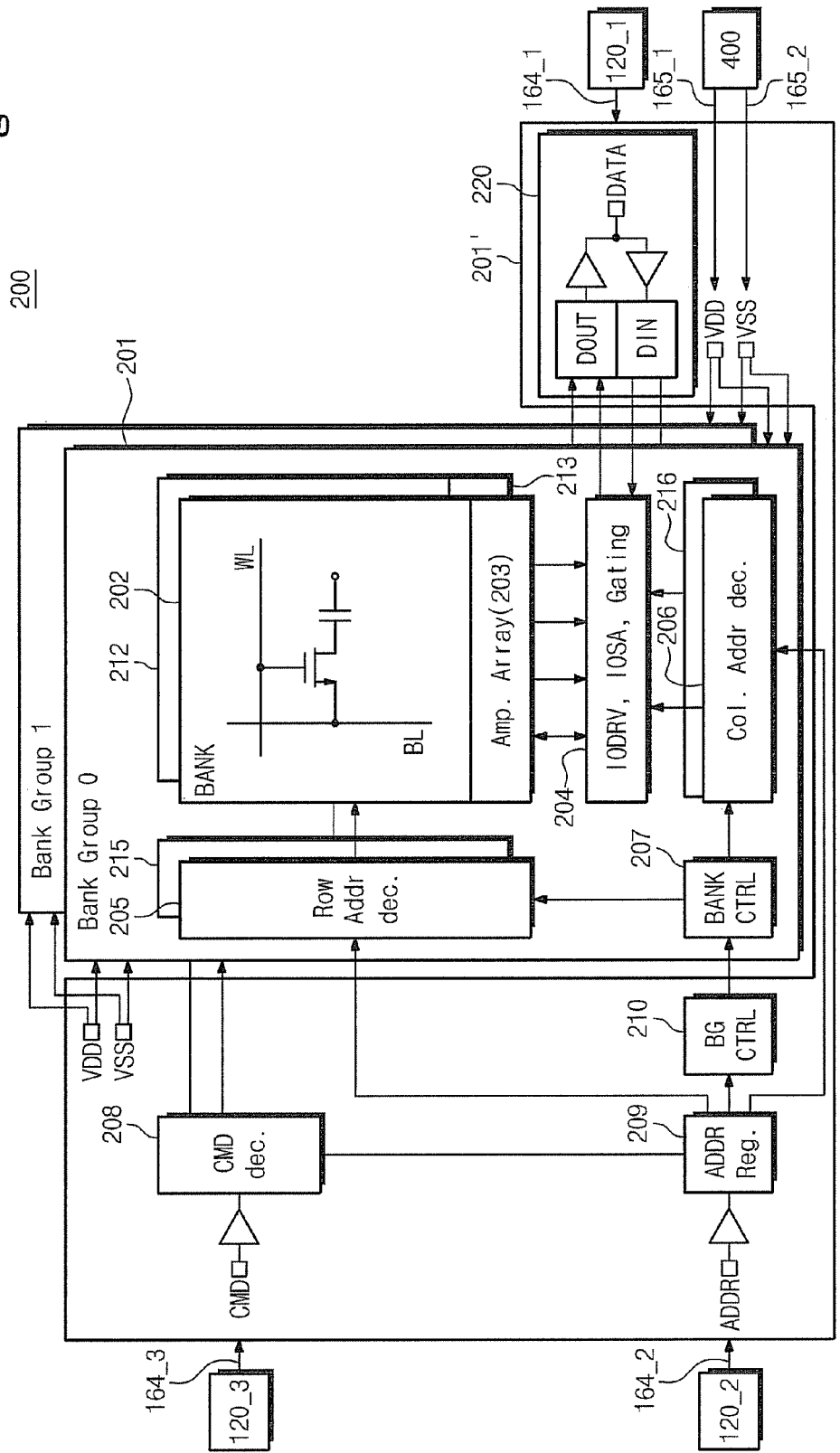
FIG. 5 is a diagram illustrating a transmission path of signal and power for operating a memory chip, and a configuration of the memory chip in a semiconductor apparatus according to an embodiment of the inventive concepts.

FIG. 5 is a diagram illustrating a supply path of signals DATA, ADDR and CMD and powers VDD and VSS for operating a memory chip 200, and a configuration of the memory chip 200 according to an embodiment of the inventive concepts. Referring to FIGS. 2 and 5, the signals for operating the memory chip 200 may be delivered from a memory control circuit 120 of a logic chip 100 to the memory chip 200 through a first via 164. The memory chip 200 may include a memory cell 201, a sense amp array 203, an input/output driver and input/output sense amp 204, a row address decoder 205, and a column address decoder 206. When the memory chip 200 is controlled by a unit of a bank, the memory chip 200 may further include a bank control unit 207 to control each bank. Also, the memory chip 200 may further include a command decoder 208 for decoding a command signal CMD from the logic chip 100, an address register 209, a bank group control unit 210, and a data input/output unit 220. When the memory chip 200 comprises a plurality of banks, the memory chip 200 may further include another bank 212, a row address decoder 215, and a column address decoder 216. Alternatively, when another memory chip is stacked over the memory chip 200, the bank 212, the row address decoder 215, and the column address decoder 216 may be included in the memory chip stacked over the memory chip 200.

The data signal DATA may be generated in a data circuit 120_1 of the logic chip 100 to be supplied to a data input/output unit 220 of the memory chip 200 through a signal through via 164_1. The address signal ADDR may be generated in an address circuit 120_2 of the logic chip 100 to be supplied to an address register 209 through an address signal through via 164_2. The command signal CMD may be generated in a command circuit 120_3 to be supplied to a command decoder 208 of the memory chip 200 through a command signal through via 164_3.

The power voltage VDD and the ground voltage VSS for operating the memory chip 200 may be supplied from the package substrate 400 to the memory chip 200 through the power voltage through via 165_1 and the ground voltage through via 165_2, respectively.

The delivery paths of the power voltage VDD and the ground voltage VSS may vary according to the operating characteristics of the components of the memory chip 200. For example, when the operating characteristics are affected by a noise, the power voltage VDD and the ground voltage VSS delivered to a memory bank and a sense amp may be delivered through the power voltage through via 165_1 and the ground voltage through via 165_2 that are separated from each other. In an embodiment, when the operating characteristics are not sensitively affected by a noise, the address decoders 202, 206, 212 and 216 may be provided with the power voltage VDD and the ground VSS through the same power voltage through via 165_1 and ground voltage through via 165_2.

According to an embodiment of the inventive concepts, a noise generated in the power voltage VDD and/or the ground voltage VSS supplied to the memory chip 200 can be reduced by insulating delivery paths of a power voltage VDD and/or a ground voltage VSS supplied to the memory chip 200 from the function circuits 120, 130, 132 and 136 of the logic chip 100.

Figure 6:
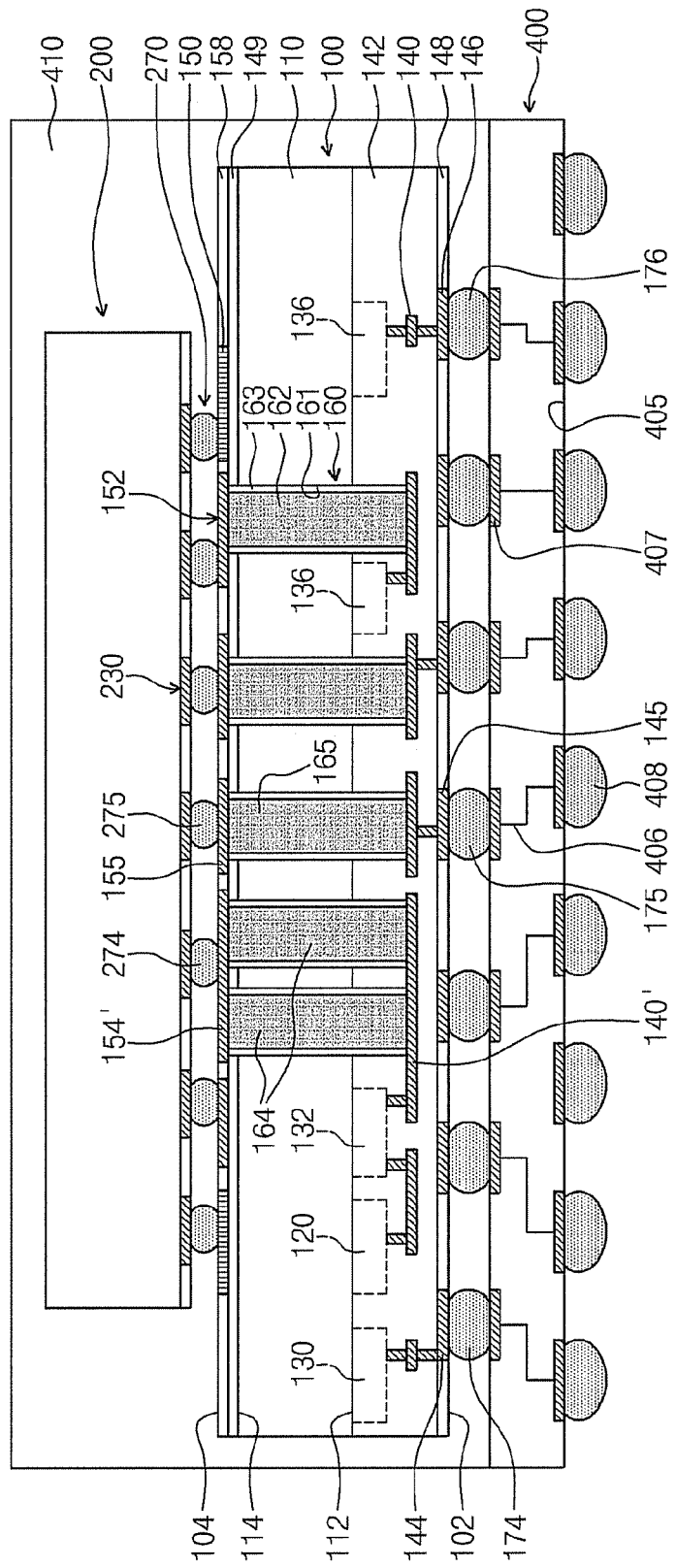
FIG. 6 is a cross-sectional view illustrating a semiconductor apparatus according to an embodiment of the inventive concepts.

FIG. 6 is a cross-sectional view illustrating a semiconductor apparatus 1010 according to an embodiment of the inventive concepts. In the semiconductor apparatus 1010 of FIG. 6, a plurality of through vias (or, through silicon vias) may be formed to transmit a same signal.

Referring to FIG. 6, a plurality of first through vias 164 may be connected to a memory control circuit 120. The first through vias 164 may transmit a same signal. A micro input/output circuit 132 may be disposed between the memory control circuit 120 and at least one of the first through vias 164. Lower ends of respective first through vias 164 may be connected to each other through a first internal wiring 140', and upper ends of respective first through vias 164 may be connected to one signal connection pad 154'. The first through vias 164 may be formed to have a diameter identical to, substantially similar to, or smaller than those of other through vias 160.

Although one of the first through vias 164 fails to connect the memory control circuit 120 to the signal connection pad 154', another first through via 164 may connect the control circuit 120 to the signal connection pad 154'. Accordingly, a connection defect of the first through via 164 can be prevented.

Figure 7:
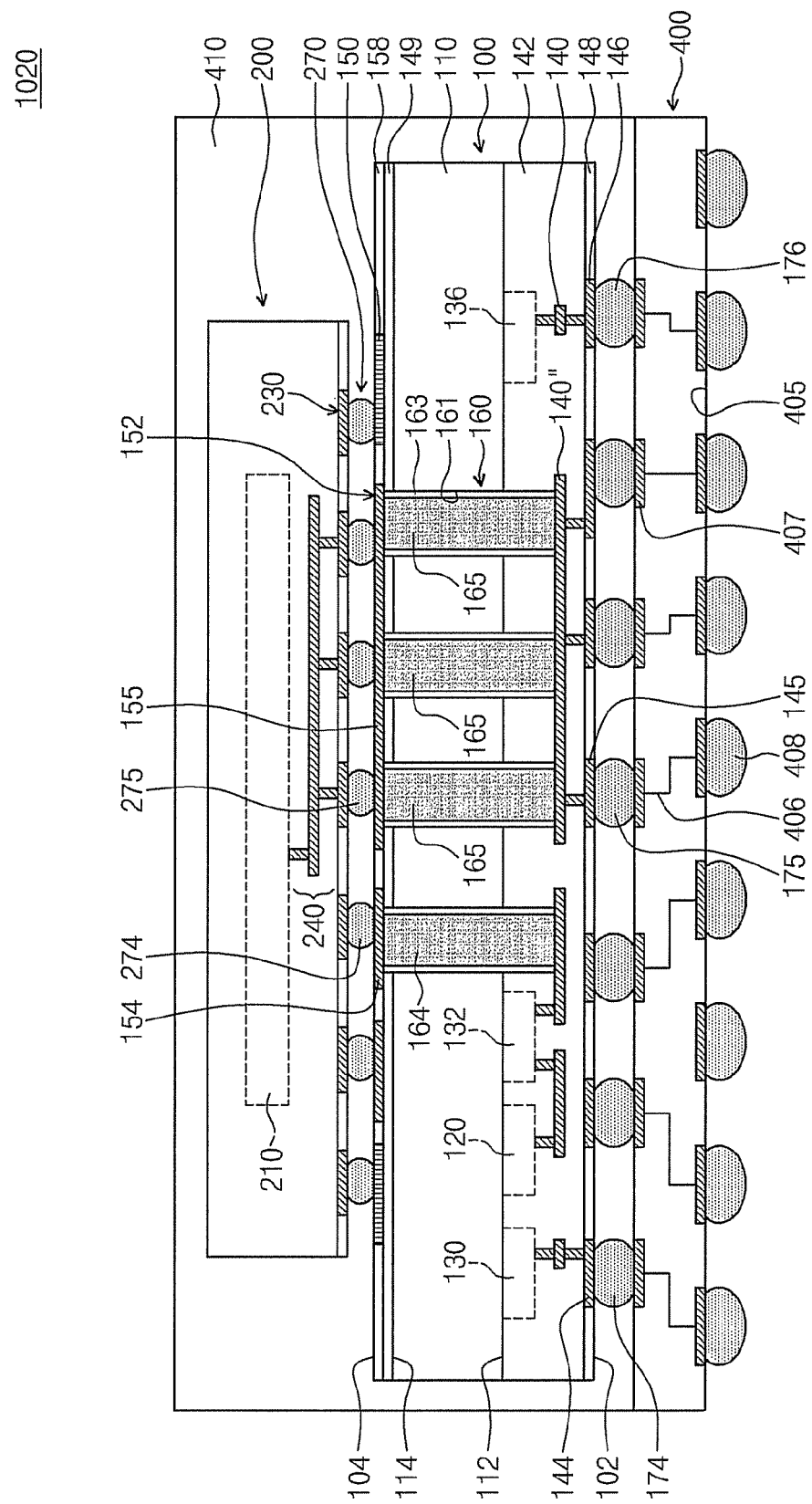
FIG. 7 is a cross-sectional view illustrating a semiconductor apparatus according to an embodiment of the inventive concepts.

FIG. 7 is a cross-sectional view illustrating a semiconductor apparatus 1020 according to an embodiment of the inventive concepts. In the semiconductor apparatus 1020 of FIG. 7, a plurality of through vias (or through silicon vias) may be formed to transmit a same power.

Referring to FIG. 7, a plurality of second through vias 165 may be formed to deliver power to the memory chip 200. The second through vias 165 may deliver a power voltage VDD and a ground voltage VSS that have a same voltage level. Lower ends of respective second through vias 165 may be connected to each other through a first internal wiring 140", and upper ends of respective second through vias 165 may be connected to each other through a power connection pad 155'. The power connection pad 155' may be one connection pad, or may be a plurality of connection pads that are connected to each other through the first wiring pattern 150.

Power may be connected through a second internal wiring 240 inside the memory chip 200. In this case, the second through vias 165 may not be connected to each other through the first internal wiring 140" or the power connection pad 155'. That is, power delivered through the respective second through vias 165 may be connected to each other inside the memory chip 200. The second internal wiring 240 may include at least one layer of wiring pattern and a contact plug perpendicularly connected to the wiring pattern.

Figure 8:
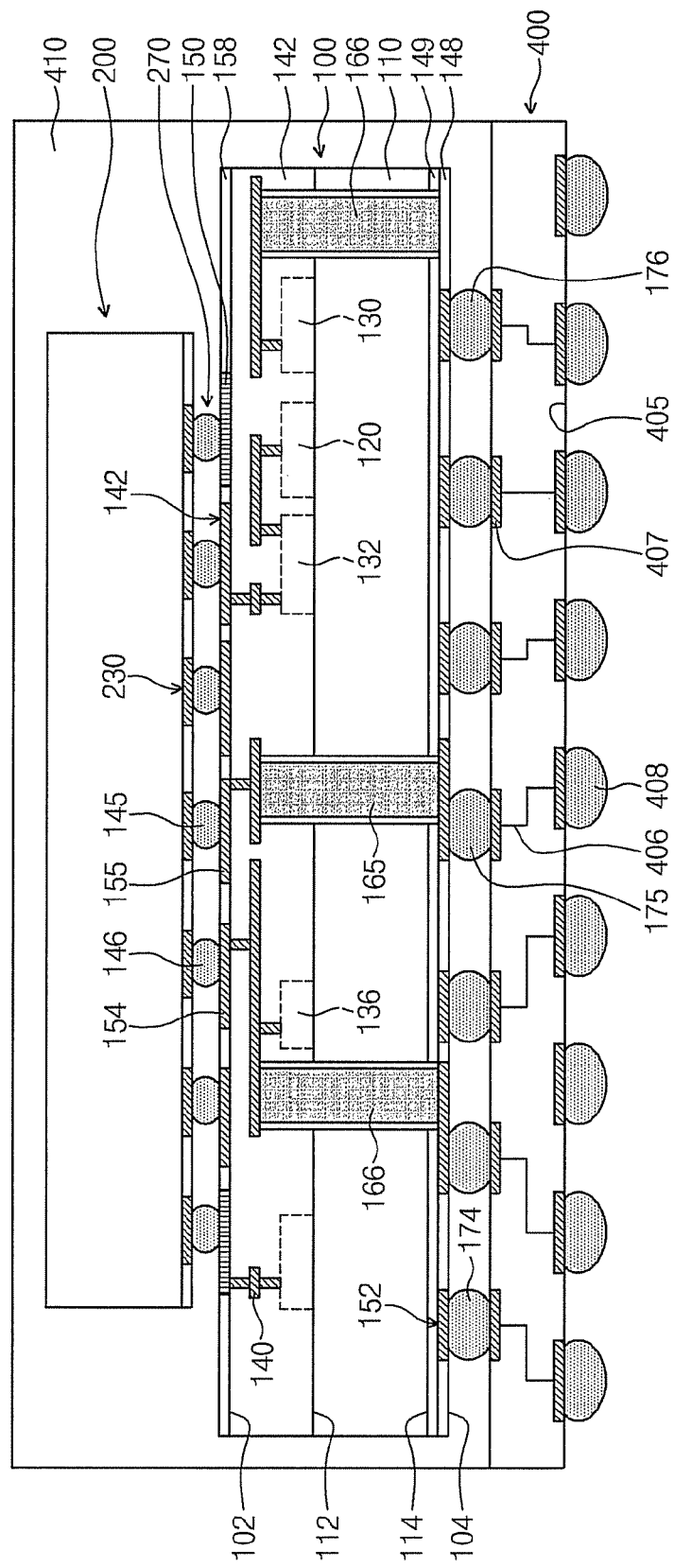
FIG. 8 is a cross-sectional view illustrating a semiconductor apparatus according to an embodiment of the inventive concepts.

According to this embodiment, since a plurality of second through vias 165 are connected in parallel to each other with respect to the same power, the resistance of a power delivery path can be reduced. Accordingly, transmission characteristics of power can be improved while the through vias 164 and 165 of the logic chip 100 are formed to have a same diameter. When power is connected through the second internal wiring 240, it is possible to reduce a delay difference according to the location of a memory circuit 210 in the memory chip 200. FIG. 8 is a cross-sectional view illustrating a semiconductor apparatus 1100 according to an embodiment of the inventive concepts. In the semiconductor apparatus 1100 of FIG. 8, the second surface 104 of the logic chip 100 may be mounted to face the package substrate 400.

Referring to FIG. 8, the logic chip 100 may be mounted on the package substrate 400 such that the first surface 102 of the logic chip 100 faces the memory chip 200, and the second surface 104 thereof faces the package substrate 400. Function circuits 120, 130, 132 and 136 may be formed closer to the first surface 102 of the logic chip 100. According to this embodiment, the semiconductor apparatus 1100 may include a third through via 166 that electrically connects the function circuits 130 and 136 to the package substrate 400. Since the first surface 102 of the logic chip 100 faces the memory chip 200, a logic chip pad 142 formed on the first surface 102 of the logic chip 100 may face the conductive member 270 of the memory chip 200. Accordingly, the logic chip pad 142 may be a connection pad for connection with the conductive member 270.

According to this embodiment, the function circuits 120, 130, 132 and 136 are formed closer to the memory chip 200 as compared to an embodiment shown in connection with FIG. 7. Accordingly, a high-speed operation may be possible between the function circuits 120, 130, 132 and 136 and the memory chip 200. Since the memory chip 200 and the function circuits 120, 130, 132 and 136 are connected to each other through a first internal wiring 140 and logic chip pads 142 and 146, a through via for interfacing the memory chip 200 and the logic chip 100 may not be required. Accordingly, it is possible to reduce the number of the through vias and increase the degree of freedom in the layout design of the function circuits 120, 130, 132 and 136.

Figure 9:
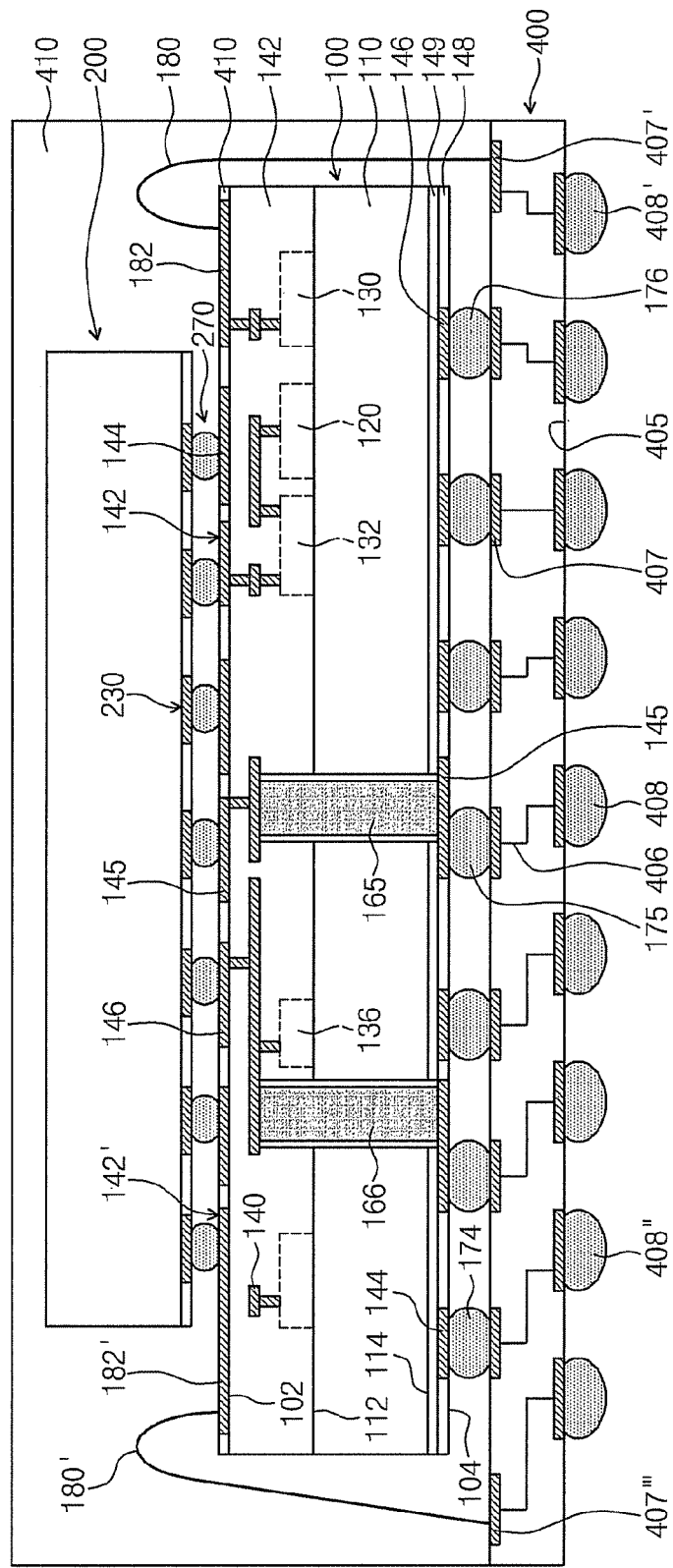
FIG. 9 is a cross-sectional view illustrating a semiconductor apparatus according to an embodiment of the inventive concepts.

FIG. 9 is a cross-sectional view illustrating a semiconductor apparatus 1110 according to an embodiment of the inventive concepts. In the semiconductor apparatus 1110 of FIG. 9, the second surface 104 of the logic chip 100 may face a package substrate 400, and the logic chip 100 may further include a bonding wire 180.

Referring to FIG. 9, the logic chip 100 may include the bonding wire 180 connected to the package substrate 400. The logic chip 100 may include a bonding pad 182 for bonding of the bonding wire 180 on the first surface 102. For example, a signal and/or power for operating the logic chip 100 may be delivered to the logic chip 100 through the bonding wire 180. In this case, the bonding pad 182 may be a portion of logic chip pads 142, or may be connected to a portion of the logic chip pads 142. The bonding pad 182 may be connected to at least one of function circuits inside the logic chip 100 through a first internal wiring 140. Alternatively, a signal and/or power for operating the memory chip 200 may be delivered to the memory chip 200 through a bonding wire 180'. In this case, the bonding pad 182' may be insulated from function circuits 120, 130 and 132 of the logic chip 100, and may be connected to the memory chip 200. The logic chip 100 may include a connection pad 142' that is not connected to the function circuits 120, 130 and 132 on the first surface 102. The logic chip 100 may include a rewiring connecting the bonding pad 182' and the connection pad 142' on the first surface 102. According to the characteristics of power for operating the memory chip 200, a portion of power may be supplied to the memory chip 200 through the bonding wire 180, and another portion of power may be supplied to the memory chip 200 through a second through via 165.

The package substrate 400 may include wire bonding pads 407' and 407" for bonding of the bonding wire 180 and 180'. A signal of the logic chip 100 delivered through the bonding wire 180 may be supplied to the logic chip 100 through a conductive member 408' and the wire bonding pad 407' of the package substrate 400 via a path independent of other signals. Power of the memory chip 200 delivered through the bonding wire 180' may be supplied to the memory chip 200 through a conductive member 408" and the wire bonding pad 407" of the package substrate 400 via a path independent of other power.

Figure 10:
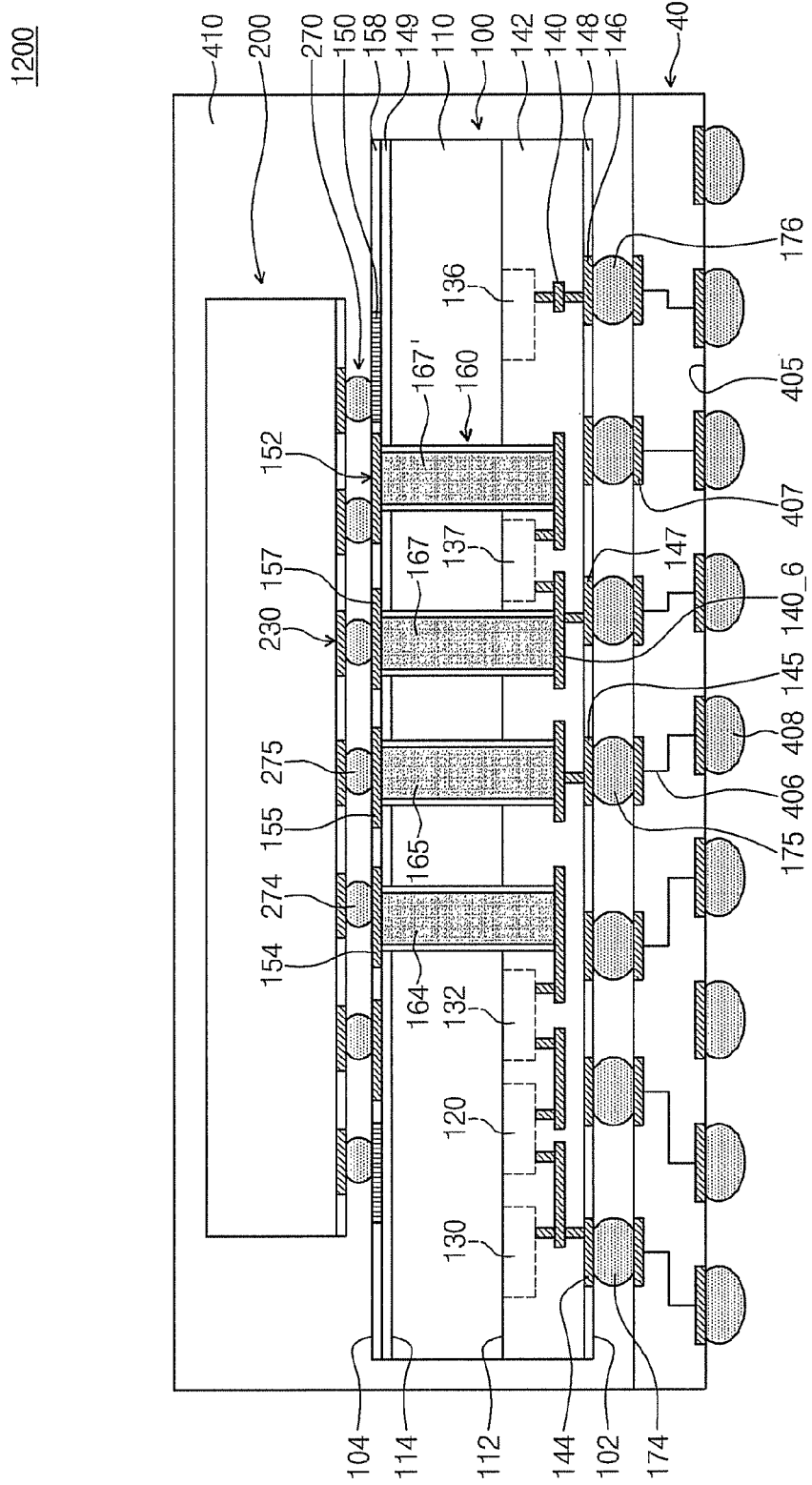
FIG. 10 is a cross-sectional view illustrating a semiconductor apparatus according to an embodiment of the inventive concepts.

FIG. 10 is a cross-sectional view illustrating a semiconductor apparatus 1200 according to an embodiment of the inventive concepts. In the semiconductor apparatus 1200 of FIG. 10, the logic chip 100 and the memory chip 200 may be supplied with a same power.

Referring to FIG. 10, the logic chip 100 may further include a common power through via 167. One end of the common power through via 167 may be connected to a function circuit 137 of a logic chip 100, and the other end thereof may be connected to a connection pad 157. The common power through via 167 may be connected to the function circuit 137 through a first internal wiring 140_6. When both the logic chip 100 and the memory chip 200 use a common power having the same voltage level, the common power may be supplied to the logic chip 100 and the memory chip 200 through the common power through via 167. According to this embodiment, the function circuit 137 may be supplied with power for operating the logic chip 100 from the outside through a logic chip pad 147 and the first internal wiring 140_6. The common power may also be supplied to the memory chip 200 through the common power through via 167 connected to the function circuit 137. For example, the function circuit 137 may include a power branch circuit. Power supplied from the outside to the function circuit 137 through the package substrate 400 may be branched into first and second voltage levels to be delivered to other function circuits 120, 130, 132 and 136 and the memory chip 200. In this case, the first and second voltage levels may be delivered to the memory chip 200 through different common power through vias 167 and 167'.

Figure 11:
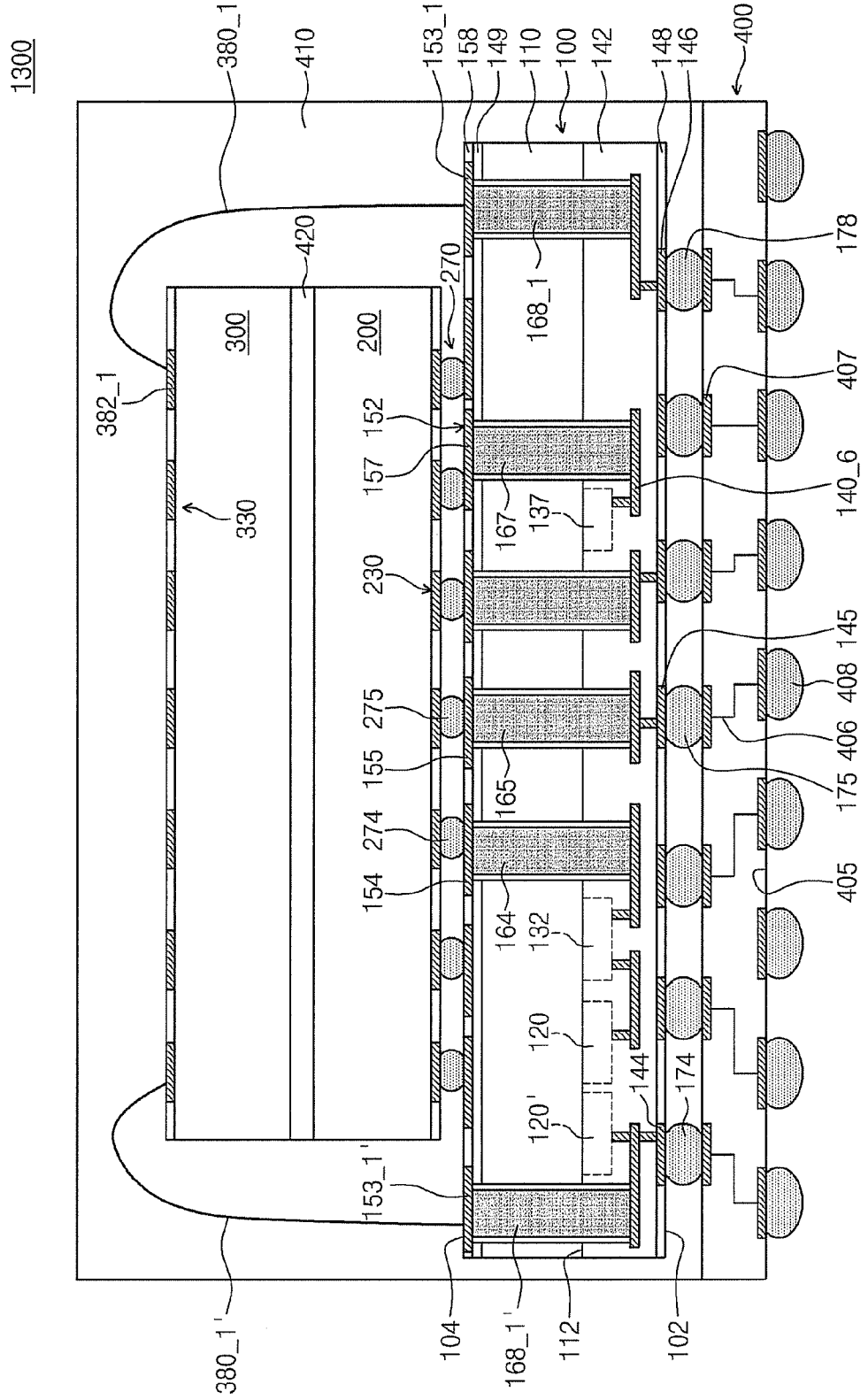
FIG. 11 is a cross-sectional view illustrating a semiconductor apparatus according to an embodiment of the inventive concepts.

FIG. 11 is a cross-sectional view illustrating a semiconductor apparatus 1300 according to an embodiment of the inventive concepts. In the semiconductor apparatus 1300 of FIG. 11, two memory chips 200 and 300 may be stacked over the logic chip 100. Three or more memory chips may be stacked over the logic chip 100 according to embodiments of the inventive concepts.

Referring to FIG. 11, the first memory chip 200 and a second memory chip 300 may be stacked over the logic chip 100. The first memory chip 200 and the second memory chip 300 may be a same kind of memory chips or different kinds of memory chips. For example, the first memory chip 200 may include a wide I/O memory for a high-speed operation of the logic chip 100, and the second memory chip 300 may include a flash memory. As an example, the wide I/O memory 200 may include more input/output terminals than the flash memory 300, and may electrically interface with the logic chip 100. The first memory chip 200 may include a synchronous DRAM that operates in synchronization with the logic chip 100. As an example, the first memory chip 200 and the second memory chip 300 may be wide I/O memories for a high-speed operation of the logic chip 100.

The first memory chip 200 may be mounted on the second surface 104 of the logic chip 100 by a flip-chip bonding method. For example, a conductive member 270 of the first memory chip 200 may be connected to a connection pad 152 of the logic chip 100. The first memory chip 200 may be connected to the logic chip 100 through a signal conductive member 274 and a first through via 164, and may be connected to the package substrate 400 through a power conductive member 275 and a second through via 165. For example, the first memory chip 200 may receive a memory control signal through the first through via 164, and may receive power through the second through via 165.

The second memory chip 300 may be stacked over the first memory chip 200. For example, the first memory chip 200 is stacked over the logic chip 100 such that a second memory chip pad 330 is located at the opposite side of a first memory chip pad 230. That is, an active surface of the second memory chip 300 may be located at the opposite side of the active surface of the first memory chip 200. The second memory chip 300 may be stacked over the first memory chip 200 using an adhesive layer 420. The adhesive layer may 420 include, for example, a die attached film.

The second memory chip 300 may be connected to the logic chip 100 by a wire bonding. Accordingly, the semiconductor apparatus 1300 according to this embodiment may include a bonding wire 380_1. For wire bonding, the logic chip 100 may further include a wire bonding pad 153_1 on the second surface 104 of the logic chip 100. The wire bonding pad 153_1 may be insulated from a connection pad 152, or may be connected through rewiring. When the second memory chip 300 is supplied with common power in common with the first memory chip 200, the wire bonding pad 153_1 may be electrically connected to the second through via 165. The second memory chip 300 may further include a bonding pad 382_1 on the active surface where the second memory chip pad 330 is formed. The bonding pad 382_1 may be a portion of the second memory chip pad 330, or may be a separate pad connected to the second memory chip pad 330 through rewiring.

The logic chip 100 may include a fourth through via 168_1. The fourth through via 168_1 may be electrically connected to the bonding wire 380_1. The fourth through via 168_1 may be insulated from function circuits 120, 120', 132 and 136 to electrically penetrate the logic chip 100. For example, a signal and/or power for operating the second memory chip 300 are supplied from the outside of the semiconductor apparatus 1300, the fourth through via 168_1 may be insulated from the function circuits 120, 120', 132 and 136. Accordingly, the signal and/or power may be directly delivered from the outside to the second memory chip 300 through the package substrate 400, the connection member 178, the fourth through via 168, and the bonding wire 380_1

As an example, when the second memory chip 300 receives a signal from the second memory control circuit 120' of the logic chip 100, the logic chip 100 may include another fourth through via 168_1' electrically connected to the second memory control circuit 120'. The signal of the second memory chip 300 may be generated in the second memory control circuit 120', and may be delivered to the second memory chip 300 through a bonding wire 380_1' electrically connected to the fourth through via 168_1' and the fourth through via 168_1.

As an example, a portion of signal may be delivered to the second memory chip 300 through the fourth through via 168_1 and the bonding wire 380_1 that are insulated from the function circuits 120 and 120', and other portion of signal may be delivered to the second memory chip 300 through the fourth through via 168_1' and the bonding wire 380_1' that are connected to the second memory control circuit 120'.

The semiconductor apparatus 1300 may include a molding 410 covering at least a portion of the package substrate 400, the logic chip 100, the first memory chip 200, and the second memory chip 300. The molding 410 may be formed to cover at least the bonding wires 380_1 and 380_1'. Accordingly, the bonding wires 380_1 and 380_1' can be protected from such as external humidity.

FIGS. 12A through 12F are diagrams illustrating a signal and/or power delivery path in the semiconductor apparatus 1300 according to an embodiment of the inventive concepts.

Figure 12A:
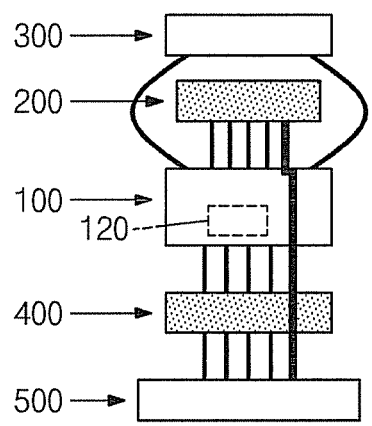
FIGS. 12A through 12F are diagrams illustrating signal and/or power transmission paths in a semiconductor apparatus according to an embodiment of the inventive concepts.

Referring to FIGS. 11 and 12A, power for operating the first memory chip 200 is delivered from a module board 500 to the package substrate 400, and is supplied to the first memory chip 200 by electrically penetrating the logic chip 100. According to this embodiment, power for operating the first memory chip 200 may be delivered to the first memory chip 200 without passing the function circuit 120 inside the logic chip 100. For example, power for operating the first memory chip 200 may be delivered to the first memory chip 200 using the second through via 165 electrically insulated from the logic chip 100.

Figure 12B:
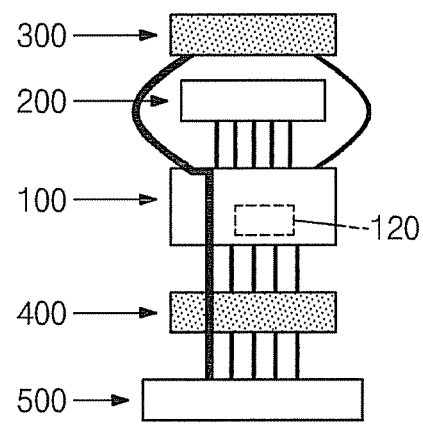

Referring to FIGS. 11 and 12B, the signal and/or power for operating the second memory chip 300 is delivered from the module board 500 to the package substrate 400, and is supplied to the second memory chip 300 through the fourth through via 168-1 and the bonding wire 380_1 that are electrically insulated from the logic chip 100. According to this embodiment, the signal and/or power for operating the second memory chip 300 is delivered to the second memory chip 300 without passing the function circuit 120 inside the logic chip 100. For example, the power for operating the second memory chip 300 is delivered to the second memory chip 300 using the second through via 165 and the bonding wire 380_1 that are electrically insulated from the logic chip 100.

As an example, the signal for operating the second memory chip 300 may be supplied from a memory controller outside the semiconductor apparatus 1300 to the package substrate 400 through the module board 500, and may be supplied to the second memory chip 300 using the fourth through via 168 and the bonding wire 380_1 that are electrically insulated from the logic chip 100.

Figure 12C:
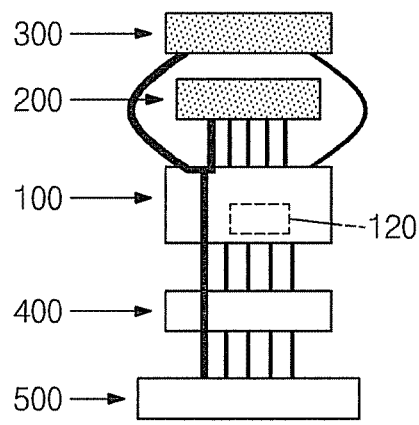

Referring to FIGS. 11 and 12C, the first memory chip 200 and the second memory chip 300 may use a common operation power. The common operation power may be delivered from the module board 500 to the package substrate 400, and may be supplied to the first memory chip 200 and the second memory chip 300 by electrically penetrating the logic chip 100. In an embodiment, electrically penetrating refers to a situation where the power penetrates the logic chip 100 without contacting any integrated circuits. According to this embodiment, the common power for operating the first memory 200 and the second memory chip 300 is delivered to the first memory chip 200 and the second memory chip 300 without passing the function circuit 120 inside the logic chip 100. For example, the common power is supplied to the first memory chip 200 through the second through via 165 electrically insulated from the logic chip 100, and is supplied to the second memory chip 300 through the fourth through via 168 and the bonding wire 380_1. As an example, the common power is delivered to the first memory chip 200 after penetrating the logic chip 100 through the second through via 165, or is delivered to the second memory chip 300 through a rewiring connected to the bonding wire 380_1.

Figure 12D:
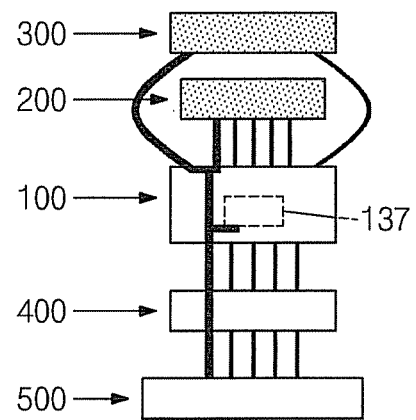

Referring to FIGS. 11 and 12D, the logic chip 100, the first memory chip 200, and/or the memory chip 300 may use common power for operation. The common power is delivered from the module board 500 to the package substrate 400, and is supplied to the logic chip 100, the first memory chip 200, and/or the second memory chip 300. The logic chip 100 may include a function circuit 137 and a common power through via 167 connected to the function circuit 137. For example, the common power is supplied to the function circuit 137 inside the logic chip 100 through a first internal wiring 140_6. As an example, the common power is supplied to the first memory chip 200 and/or the second memory chip 300 through the common power through via 167. The common power through via 167 may be connected to the first memory chip 200 through a connection pad 157, or may be connected to a bonding pad 153_1 and a bonding wire 380_1. Accordingly, the common power is delivered to the first memory chip 200 and/or the second memory chip 300 through the common power through via 167.

Figure 12E:
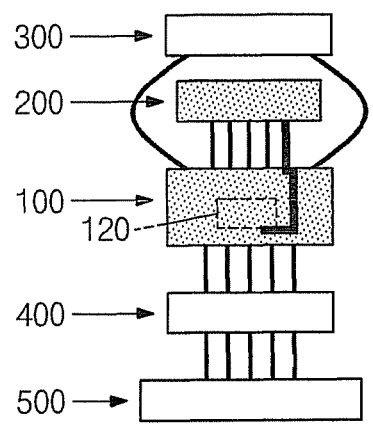

Referring to FIGS. 11 and 12E, a signal for operating the first memory chip 200 may be supplied from the memory control circuit 120 of the logic chip 100 to the first memory chip 200. According to this embodiment, the signal for operating the first memory chip 200 is generated in the memory control circuit 120 without receiving signals from the package substrate 400 or the external module substrate 500, and is delivered to the first memory chip 200. For example, the signal for operating the first memory chip 200 is delivered to the first memory chip 200 using the first through via 164 connected to the memory control circuit 120.

Figure 12F:
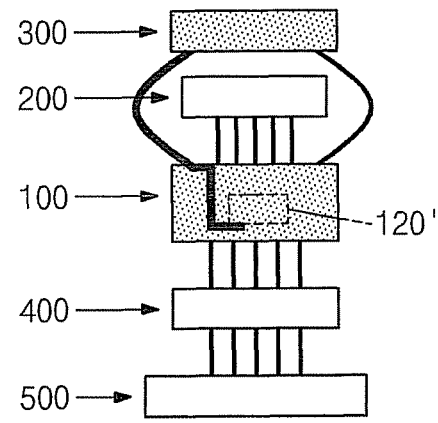

Referring to FIGS. 11 and 12F, a signal for operating the second memory chip is supplied from the second memory control circuit 120' of the logic chip 100 to the second memory chip 300. According to this embodiment, the signal for operating the second memory chip 300 is generated in the second memory chip 300 without receiving signals from the package substrate 400 or the external module substrate 500, and is delivered to the second memory chip 300. For example, the signal for operating the second memory chip 300 is delivered to the second memory chip 300 through the first through via 168_1' and the bonding wire 380_1' connected to the second memory control circuit 120'.

Figure 13:
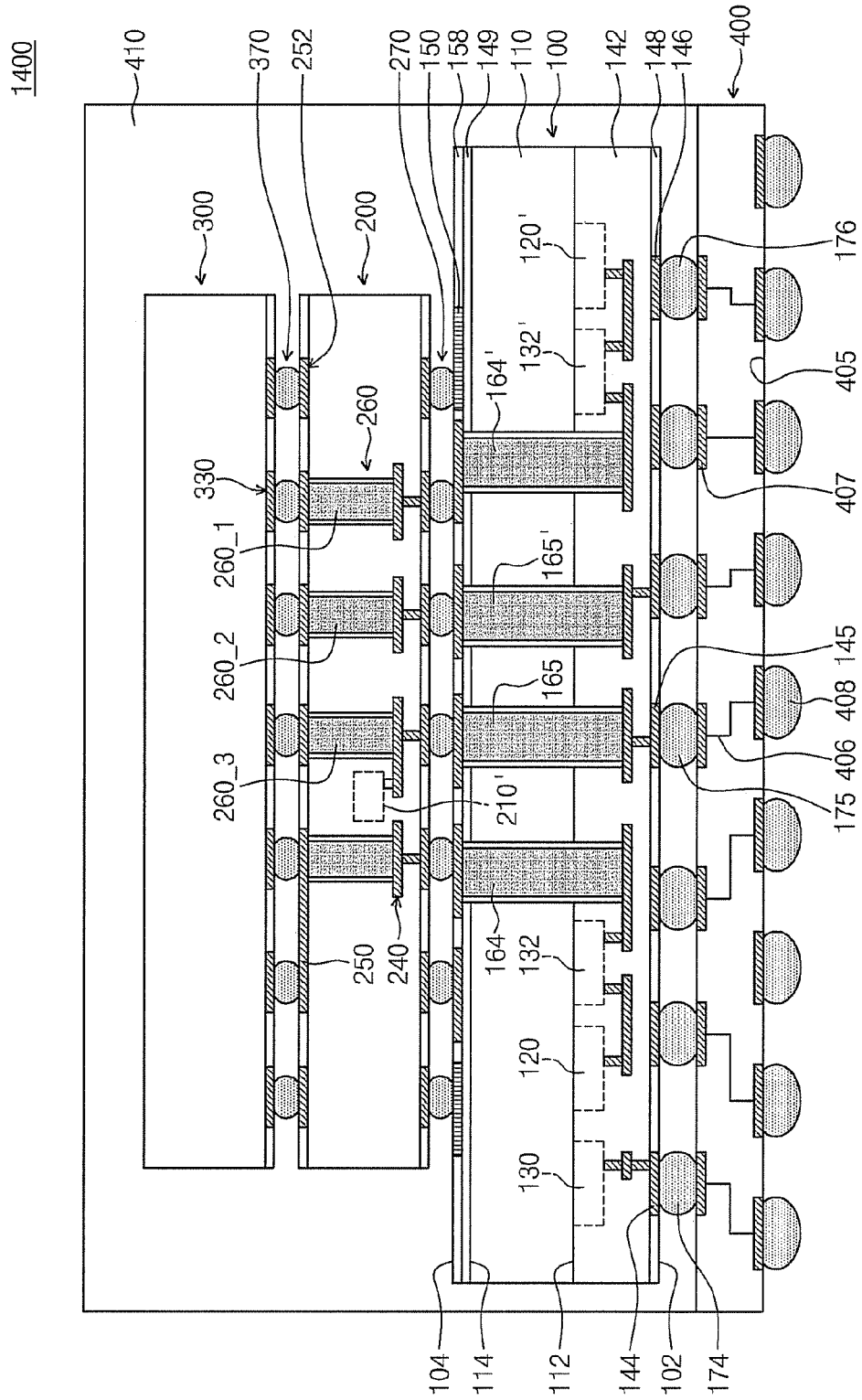
FIG. 13 is a cross-sectional view illustrating a semiconductor apparatus according to an embodiment of the inventive concepts.

FIG. 13 is a cross-sectional view illustrating a semiconductor apparatus 1400 according to an embodiment of the inventive concepts. In the semiconductor apparatus 1400 of FIG. 13, the first memory chip 200 may include a fifth through via 260.

Referring to FIG. 13, a first memory chip 200 and a second memory chip 300 may be stacked over a logic chip 100. The first memory chip 200 and the second memory chip 300 may include the same memory circuit structure. For example, the first memory chip 200 and the second memory chip 300 may be a same kind of wide I/O memory chips. The first memory chip 200 and the second memory chip 300 may be sequentially stacked in the same manner. For example, the first memory chip 200 is stacked over the logic chip 100 by a flip-chip manner, and the second memory chip 300 is stacked over the first memory chip 200 by the flip-chip manner. Accordingly, the first memory chip 200 and the second memory chip 300 are stacked over the logic chip 100 such that a first memory chip pad 230 and a second memory chip pad 330 face the logic chip 100. Conductive members 270 of the first memory chip 200 may be disposed in vertical alignment with conductive member 370 of the second memory chip 300.

The first memory chip 200 may further include a fifth through via 260 penetrating at least a portion of the first memory chip 200. The fifth through via 260 may be signal and/or power delivery path(s) of the second memory chip 300.

For example, a signal for operating the second memory chip 300 may be generated in a second memory control circuit 120' of the logic chip 100 to delivered to the second memory chip 300 through a first through via 164' and a fifth through via 260_1 connected to the second memory control circuit 120'. The signal may be delivered from the second memory circuit 120' to the first through via 164' through a micro I/O circuit 132'.

Power for operating the second memory chip 300 may be delivered from the package substrate 400 to the second memory chip 300 through a second through via 165' and a fifth through via 260_2. When the first memory chip 200 includes a plurality of fifth through vias 260, at least one of fifth through vias (e.g., 260_1 or 260_2) may electrically penetrate the first memory chip 200.

A signal for operating the first memory chip 200 may be generated in a memory control circuit 120 of the logic chip 100 to be delivered to the first memory chip 200 through a first through via 164 connected to the memory control circuit 120. Power for operating the first memory chip 200 may be delivered from the package substrate 400 to the first memory chip 200 through a second through via 165.

According to this embodiment, since signals are delivered through the first through vias 164 and 164' connecting the memory control circuits 120 and 120' to the memory chips 200 and 300, a high-speed operation may be achieved between the logic chip 100 and the memory chips 200 and 300. In an embodiment, since the signal of the second memory chip 300 is delivered through the through vias 164' and 260_1, the length of a signal delivery path may be shorter than that in a structure in which a signal is delivered through the bonding wire 380_1 like in FIG. 11.

According to this embodiment, since power is delivered through the second through vias 165 and 165' electrically insulated from the logic chip 100, the length of a power delivery path may be shortened between the package substrate 400 and the memory chips 200 and 300, thereby enabling a high-speed operation. In an embodiment, power of the second memory chip 300 may be electrically delivered to the logic chip 100 and the first memory chip 200 through the through vias 165' and 260_2.

When the first memory chip 200 and the second memory chip 300 use a same power, the power may be simultaneously delivered to the first memory chip 200 and the second memory chip 300 through a fifth through via 260_3 connected to the memory circuit 210' of the first memory chip 200. The fifth through electrode 260_3 may be connected to a memory circuit 210' through a second internal wiring 240. The fifth through via 260 may be distributed or grouped over a region where the memory circuit 210' is not formed. For example, the memory circuit 210' may be disposed between the through vias. In an embodiment, the memory circuit 210' may be disposed at the edge region of the first memory chip 200, and the fifth through via 260 may be disposed at a central region.

As an example, the first memory chip 200 and the second memory chip 300 may be a same kind of memory chips. For example, the first memory chip 200 and the second memory chip 300 may be wide I/O memories for a high-speed operation of the logic chip 100. The conductive members 370 of the second memory chip 300 may have the same pitch as the conductive members 270 of the first memory chip 200. When having the same pitch as the conductive members 370 of the second memory chip 300, the fifth through vias 260 may be disposed in a vertical alignment with the conductive members 370 of the second memory chip 300. Accordingly, the length of signal and/or power delivery path(s) can be reduced to enable a high-speed operation.

As an example, the first memory chip 200 and the second memory chip 300 may be different kinds of memory chips. The conductive members 370 of the second memory chip 300 may have different pitches from the conductive members 270 of the first memory chip 200. Accordingly, the fifth via 260 may be spaced apart from a connection pad 252 for connection of the conductive member 370 of the second memory chip 300. In this case, the first memory chip 200 may include a second wiring pattern 250 for connection of the fifth through via 260 and the connection pad 252. That is, the fifth through via 260 and the conductive member 370 of the second memory chip 300 may be connected to each other through the second wiring pattern 250.

The semiconductor apparatus 1400 may include a molding 410 that covers at least a portion of the package substrate 400, the logic chip 100, the first memory chip 200, and the second memory chip 300.

Figure 14:
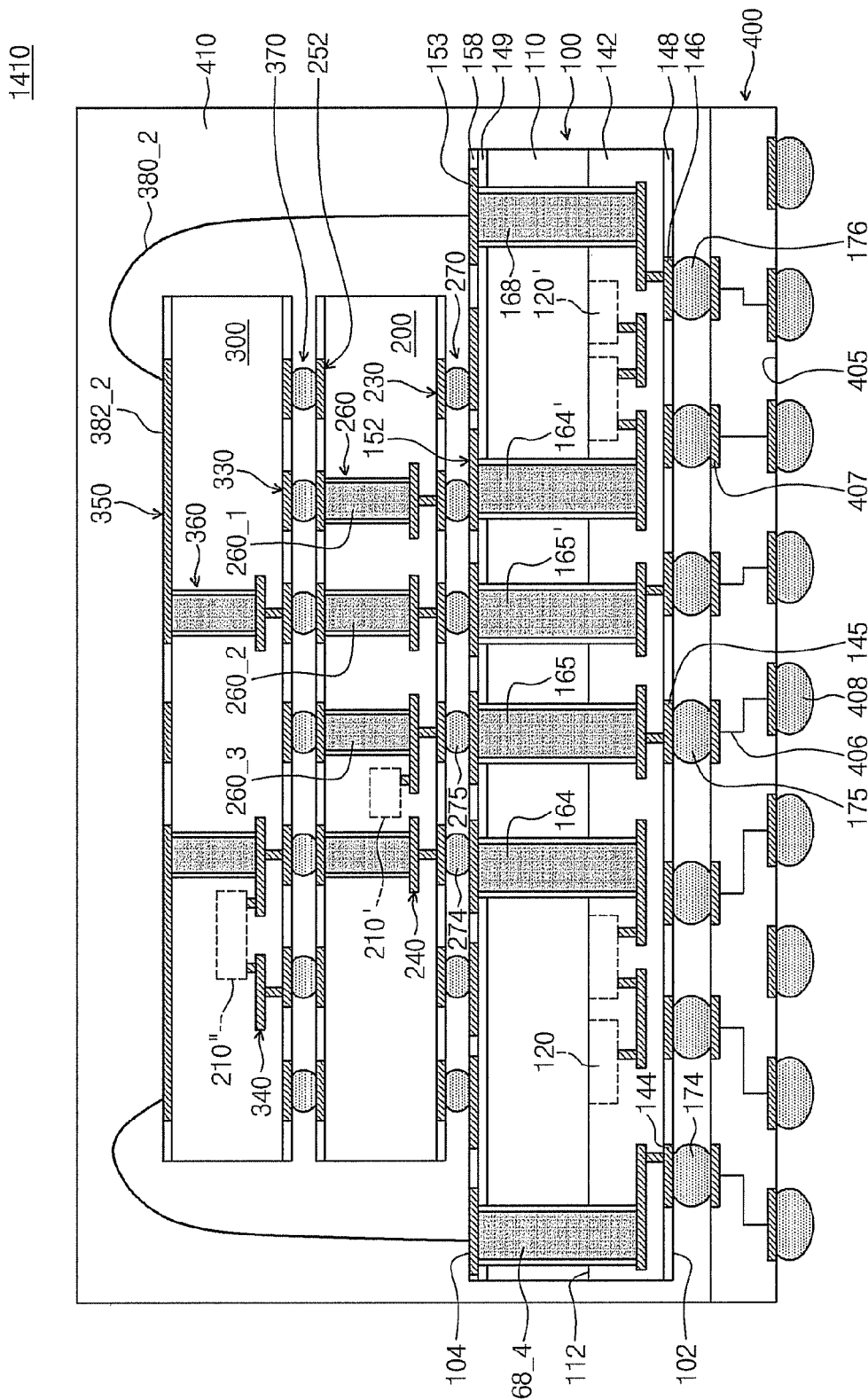
FIG. 14 is a cross-sectional view illustrating a semiconductor apparatus according to an embodiment of the inventive concepts.

FIG. 14 is a cross-sectional view illustrating a semiconductor apparatus 1410 according to an embodiment of the inventive concepts. In the semiconductor apparatus 1410 of FIG. 14, a first memory chip 200 and a second memory chip 300 may include a fifth through via 260 and a sixth through via 360.

Referring to FIG. 14, a first memory chip 200 and a second memory chip 300 may be sequentially stacked over a logic chip 100 in a flip-chip manner. For example, the first memory chip 200 and the second memory chip 300 are stacked over the logic chip 100 such that a first memory chip pad 230 and a second memory chip pad 330 face the logic chip 100. A memory circuit 210" of the second memory chip 300 is disposed closer to the surface on which the second memory chip pad 330 is formed. The memory circuit 210" may be connected to the second memory chip pad 330 through a third internal wiring 340.

The second memory chip 300 may include a sixth through via 360 and a bonding wire 380_2. The sixth through via 360 may penetrate at least a portion of the second memory chip 300 to electrically connect the bonding wire 380_2 to the memory circuit 210" of the second memory chip 300. The second memory chip 300 may include a bonding pad 382_2 for connection of the bonding wire 380_2. The bonding pad 382_2 may be provided on a surface of the second memory chip 300 opposite to the second memory chip pad 330. When the sixth through via 360 is spaced apart from the bonding pad 382_2, the bonding pad 382_2 may be connected to the sixth through via 360 through a third wiring pattern 350.

According to an embodiment, signal and/or power for operating the second memory chip 300 may be delivered to the second memory chip 300 through the fifth through via 360, or may be delivered to the second memory chip 300 through the bonding wire 380_2 and the sixth through via 360. For example, the signal and/or power of the second memory chip 300 may be generated in an external or logic chip 100 of the semiconductor apparatus 1410 to be delivered to the memory circuit 210" through the conductive member 370 and the third internal wiring 340 of the second memory chip 300. The signal and/or power of the second memory chip 300 may be delivered from the outside of the semiconductor apparatus 1410 to the memory cell 210" through the package substrate 400, the fourth through via 168 electrically insulated from the logic chip 100, the bonding wire 380_2, and the sixth through via 360. The signal may be delivered through the fifth through via 260 and the conductive member 370, and the power may be delivered through the bonding wire 380_2 and the sixth through via 360. As an example, when the second memory chip 300 includes a system code region and a mass data region, the system code region may be connected to the fifth through via 360, and the mass data region may be connected to the bonding wire 380_2. The system code may be transmitted at a high rate through the fifth through via 260, and data that is not considerably affected by the operation speed may be transmitted through the bonding wire 380_2.

According to this embodiment, the signal and/or power for operating the second memory chip 300 may be delivered though a plurality of paths. For example, the second memory chip 300 may be supplied with the signal and/or power through a first path including the fifth through via 260 and the conductive member 370 and a second path including the bonding wire 380_2 and the sixth through via 360. For example, the signal and power may be delivered to the second memory chip 300 through the first path and the second path, respectively. In this case, all of the conductive member 370 may be used for transmission of the signal. Accordingly, the number of signals that the second memory chip 300 can simultaneously input or output may increase to enable a high-speed operation.

Figure 15:
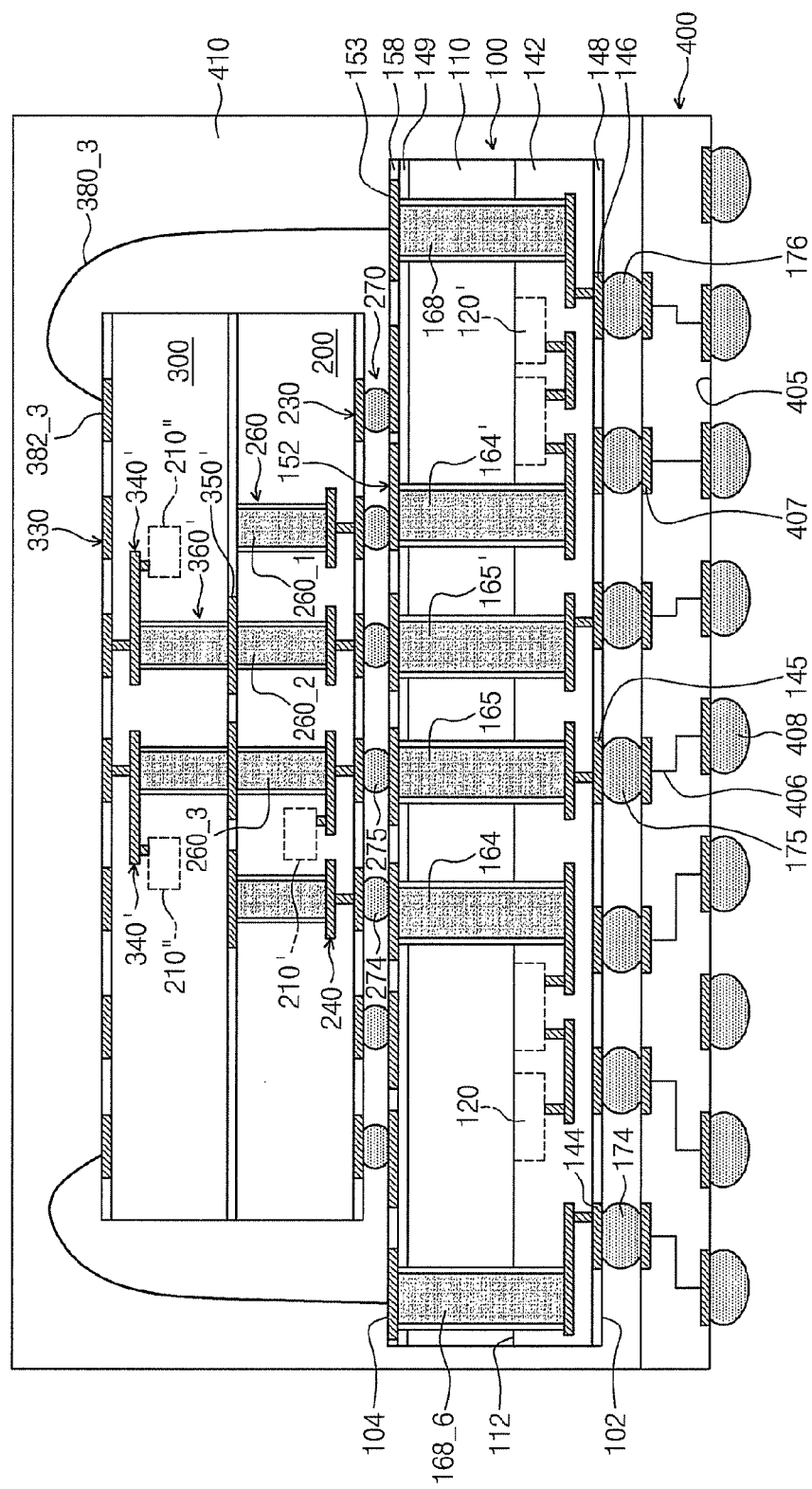
FIG. 15 is a cross-sectional view illustrating a semiconductor apparatus according to an embodiment of the inventive concepts.

FIG. 15 is a cross-sectional view illustrating a semiconductor apparatus 1420 according to an embodiment of the inventive concepts. In the semiconductor apparatus 1420 of FIG. 15, a first memory chip 200 and a second memory chip 300 include a fifth through via 260 and a sixth through via 360, respectively. Referring to FIG. 15, a first memory chip 200 and a second memory chip 300 may be sequentially stacked over a logic chip 100. The first memory chip 200 and the second memory chip 300 may be stacked over the logic chip 100 such that a first memory chip pad 230 and a second memory chip pad 330 face mutually opposite directions. For example, the first memory chip 200 may be stacked by a flip-chip manner such that the first memory chip pad 230 faces the logic chip 100, and the second memory chip 300 may be stacked such that the second memory chip pad 330 faces the opposite direction to the logic chip 100.

The second memory chip 300 may include a sixth through via 360' and a bonding wire 380_3. The sixth through via 360' may penetrate at least a portion of the second memory chip 300 to electrically connect a fifth through via 260 to the second memory chip 300. The bonding wire 380_3 may electrically connect a fourth through via 168 to the second memory chip 300. The second memory chip 300 may include a bonding pad 382_3 for connection of the bonding wire 380_3. The bonding pad 382_3 may be provided on the same surface as the second memory chip pad. The bonding pad 382_3 may be a portion of the second memory chip pad 330, or may be a separate pad connected through the second memory chip pad 330 and a third wiring pattern 350.

Signal and/or power for operating the second memory chip 300 may be delivered to the second memory chip 300 through the bonding wire 380_3 or the sixth through via 360. For example, the signal of the second memory chip 300 may be generated in an external or logic chip 100 of the semiconductor apparatus 1420 to be delivered to the memory circuit 210" through the fifth through via 260 and the sixth through via 360'. The power of the second memory chip 300 may be delivered from the outside of the semiconductor apparatus 1420 to the memory circuit 210" through the package substrate 400, the fourth through via 168 electrically insulated from the logic chip 100, and bonding wire 380_3. As an example, the signal may be delivered to the second memory chip 300 through the bonding wire 380_3, and the power may be delivered to the second memory chip 300 through the sixth through via 360'. As an example, a portion of signal and/or power may be delivered to the second memory chip 300 through the bonding wire 380_3, and other portions thereof may be delivered to the second memory chip 300 through the sixth through via 360.

A wiring pattern 350' may be disposed between the first memory chip 200 and the second memory chip 300. The wiring pattern 350' may be formed on at least one surface of the first memory chip 200 and the second memory chip 300. For example, the wiring pattern 350' may be a rewiring pattern formed on the opposite surface to the surface on which the first memory chip pad 230 of the first memory chip 200. When the fifth through via 260 is not vertically aligned with the sixth through via 360', the fifth through via 260 and the sixth through via 360' may be electrically connected to each other through the wiring pattern 350'.

According to an embodiment with reference to FIG. 15, power may be delivered through the bonding wire 380_3, and signal may be delivered through the sixth through via 360'. According to this embodiment, an operation speed of the semiconductor apparatus 1420 can be increased as compared to when signal and/or power are both delivered through a bonding wire. According to this embodiment, since the number of through vias can be smaller as compared to when signal and/or power are both delivered through vias, the degree of freedom in internal design of the second memory chip 300 can be increased.

Figure 16:
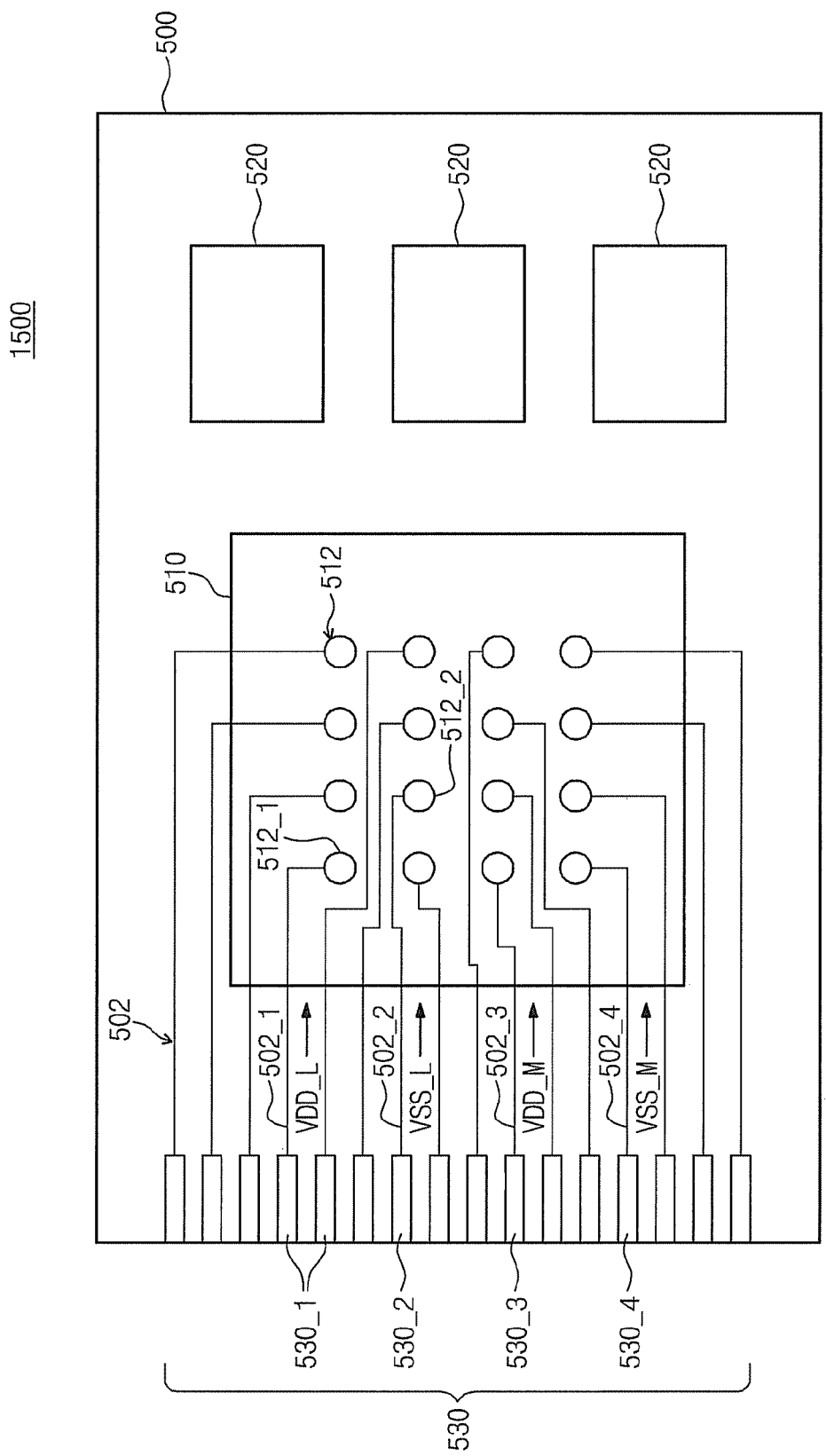
FIG. 16 is a diagram illustrating a semiconductor module according to an embodiment of the inventive concepts.

FIG. 16 is a diagram illustrating a semiconductor module 1500 according to an embodiment of the inventive concepts. Referring to FIG. 16, the semiconductor module 1500 may include a module substrate 500, and a semiconductor package 510 and an external connection terminal 530 on the module substrate 500. The module substrate 500 may be a printed circuit board including circuit patterns 502. The semiconductor module 1500 may be connected to other electronic devices positioned outside the semiconductor module 1500 through the external connection terminal 530. The semiconductor package 510 may be connected to the module substrate 500 through a conductive member 512. The conductive member 512 may include one of conductive bump, solder ball, conductive spacer, Pin Grid Array (PGA), and combination thereof. The semiconductor module 1500 may include a memory package 520. The memory package 520 may include a plurality of stacked flash memory chips.

The semiconductor package 510 may include at least one of the semiconductor apparatuses shown in FIGS. 1 through 15. For example, the semiconductor package 510 may include the semiconductor apparatus 1000 of FIG. 1.

Referring to FIGS. 1, 2, and 16, the conductive member 512 of the semiconductor package 510 may correspond to the conductive member 408 of the package substrate 400. The conductive 512 may include a plurality of solder balls for receiving signal and/or power for operating the semiconductor package 510. Power for operation of the logic chip 100 and the memory chip 200 may be supplied to the semiconductor package 510 through mutually-separated external connection terminals 530_1, 530_2, 530_3 and 530_4, respectively.

As an example, a power voltage VDD_L for operating the logic chip 100 may be delivered to a first solder ball 512_1 through the first external connection terminal 530_1 and the first circuit pattern 502_1. The first solder ball 512_1 may be connected to a function circuit inside the logic chip through a portion of a first internal wiring 140. A ground voltage VSS_L for operating the logic chip 100 may be delivered to a second solder ball 512_2 through the second external connection terminal 530_2 and the second circuit pattern 502_2. The second solder ball 512_2 may be connected to the function circuit inside the logic chip 100 through another portion of the first internal wiring 140. The portion of the first internal wiring 140 for delivery of the power voltage VDD_L and the other portion of the first internal wiring 140 for delivery of the ground voltage VSS_L may be insulated from each other.

A power voltage VDD_M for operating the memory chip 200 may be delivered to a third solder ball 512_3 through the third external connection terminal 530_3 and the third circuit pattern 502_3. The third solder ball 512_3 may be connected to a second through via 165, and the power voltage VDD_M may be delivered to the memory chip 200 through the second through via 165. A ground voltage VSS_M for operating the memory chip 200 may be delivered to a fourth solder ball 512_4 through the fourth external connection terminal 530_4 and the fourth circuit pattern 502_4. The fourth solder ball 512_4 may be connected to another second through via 165 separated from the second through via 165 transmitting the power voltage VDD_M.

According to an embodiment with reference to FIG. 16, since power of the logic chip 100 and the memory chip 200 is supplied via respective independent paths, a power noise of the semiconductor package 510 can be minimized.

Figure 17:
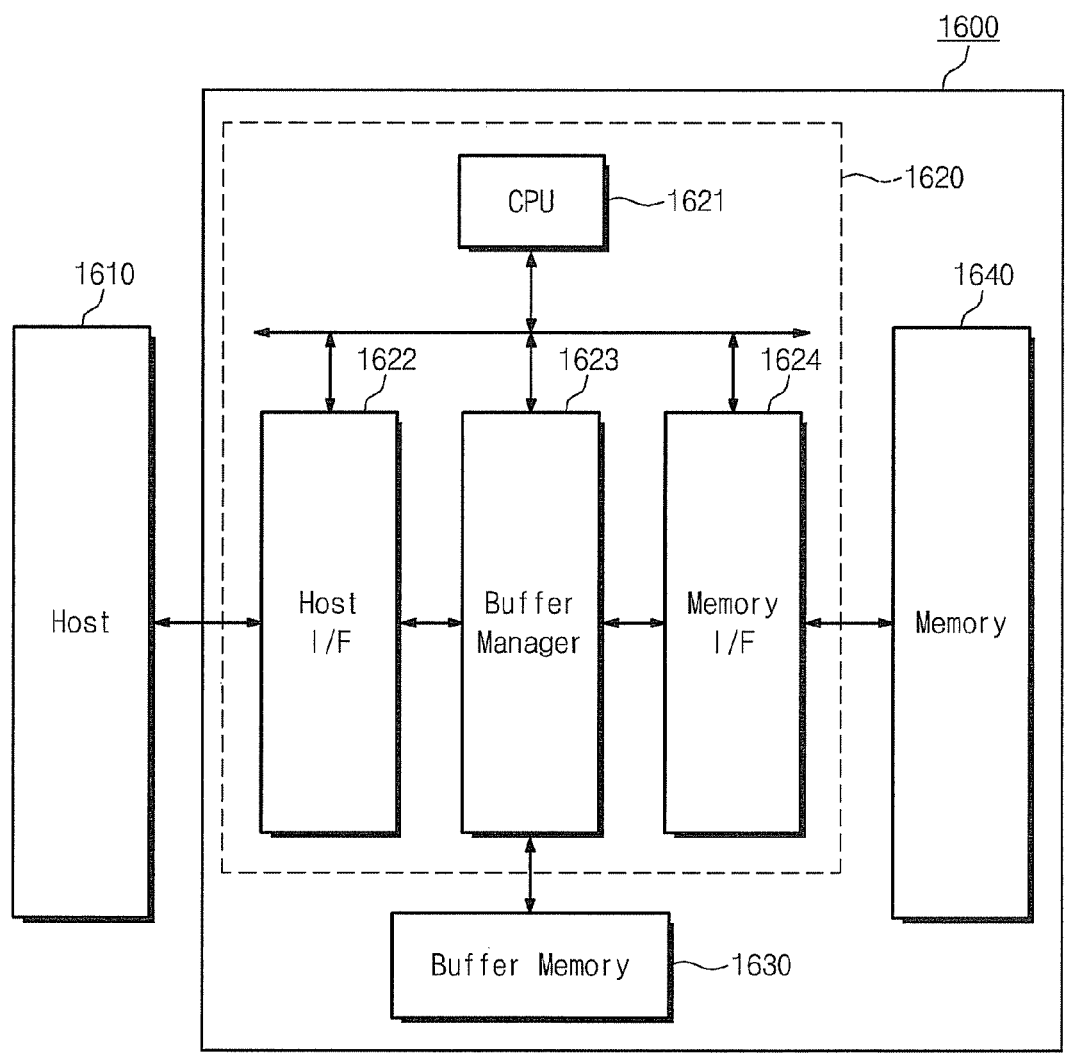
FIG. 17 is a block diagram illustrating a solid state disk including a semiconductor apparatus according to an embodiment of the inventive concepts.

FIG. 17 is a block diagram illustrating a solid state disk (SSD) 1600 to which an embodiment of the inventive concepts is applied.

Referring to FIG. 17, the SSD 1600 may interface with (e.g., electrically communicate with) a host 1610, and may include an SSD controller 1620, a buffer memory 1630, and a memory 1640. The SSD controller 1620 may include a CPU 1621, a host interface 1622, a buffer manager 1623, and a memory interface 1624. The CPU 1621 may control the respective components according to firmware for driving the SSD 1600. For example, the CPU 1621 may deliver various control signals for read/write operations to the host 1610 and the memory interface 1624, and may perform an access operation on the buffer memory 1630 or the memories 1640. The host interface 1621 may provide a physical connection with the host 1610 and the SSD 1600. That is, the host interface 1622 may provide an interface between the host 1610 and the SSD 1600. The buffer manager 1623 may control read and write operations of the buffer memory 1630. For example, the buffer memory 1630 may include a synchronous DRAM for providing a sufficient buffering space for the SSD 1600 used as a large-capacity auxiliary memory. The memories 1640 may include a non-volatile flash memory to provide a storage space of the SSD 1600. For example, the memories 1640 may include at least one of NAND flash memories, NOR flash memories, PRAMs, MRAMs, and RRAMs. The memories may be data or code storage memories. When the memories 1640 are code storage memories, the SSD 1600 may operate by itself without an input from the host 1610. The memory interface 1624 may exchange data with the memories 1640.

The SSD 1600 may include the semiconductor apparatuses according to embodiments with reference to FIGS. 1 through 15. For example, in the semiconductor apparatus 1000 of FIG. 1, the logic chip 100 may include an SSD controller 1620, and the memory chip 200 may include a buffer memory 1630. The memories 1640 may be provided in the semiconductor apparatus 1000 of FIG. 1, or may be included the second memory chip 300 of FIG. 11.

The SSD 1600 may constitute or be applied to a Multi-Media Card (MMC), a Secure Digital (SD) card, a memory stick, an ID card, or a smart card.

Figure 18:
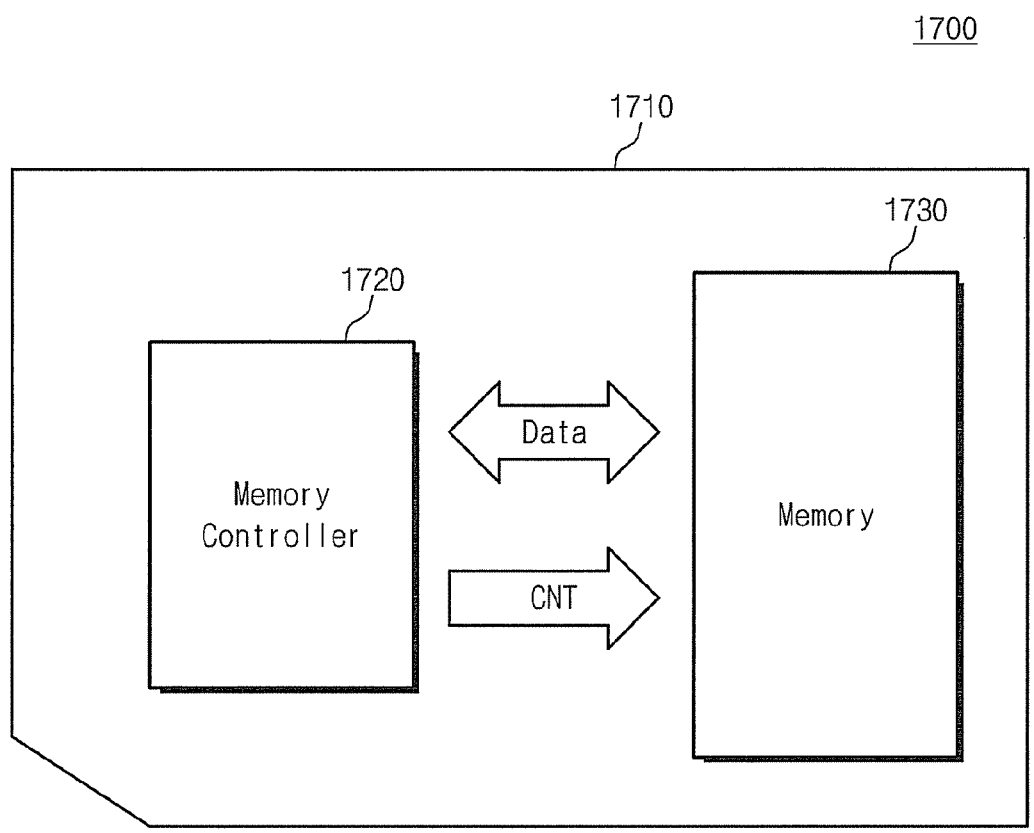
FIG. 18 is a block diagram illustrating a memory card including a semiconductor apparatus according to an embodiment of the inventive concepts.

FIG. 18 is a block diagram illustrating a memory card 1700 to which an embodiment of the inventive concepts is applied. The memory card 1700 of FIG. 18 may include a memory controller 1720 and a memory 1730. The memory controller 1720 and the memory 1730 may communicate with each other.

Referring to FIG. 18, the memory card 1700 may include the memory controller 1720 and the memory 1730 in a housing 1710. The memory controller 1720 and the memory 1730 may exchange electrical signals. For example, the memory controller 1720 and the memory 1730 may exchange a data signal DATA according to a control signal CTRL of the memory controller 1720. Thus, the memory card 1700 may store data in the memory 1730, or may output data from the memory 1730 to the outside.

The memory card 1700 may include the semiconductor apparatuses according to embodiments with reference to FIGS. 1 through 15. For example, in the semiconductor apparatus 1300 of FIG. 11, the logic chip 100 may include the memory controller 1720, and the second memory chip 300 may include the memory 1730. Accordingly, the memory controller 1720 and the memory 1730 may be provided in one semiconductor package.

Figure 19:
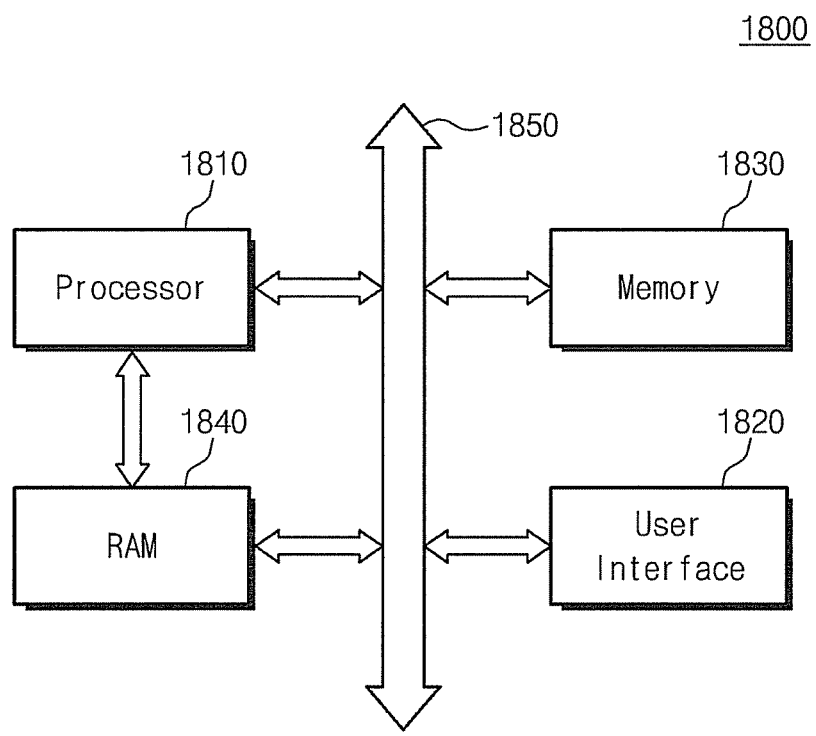
FIG. 19 is a block diagram illustrating an electronic system including a semiconductor apparatus according to an embodiment of the inventive concepts.

FIG. 19 is a block diagram illustrating an electronic system 1800 to which an embodiment of the inventive concepts is applied. The electronic system 1800 of FIG. 19 may include a processor 1810, a user interface 1820, a memory 1830, and a RAM 1840. The processor 1810, the user interface 1820, the memory 1830, and the RAM 1840 may communicate with each other through a system bus 1850. According to an embodiment, the electronic system 1800 may further include an application chipset, a Camera Image Processor (CIS), a modem, or a mobile DRAM.

Referring to FIG. 19, the processor 1810 may execute programs, and may serve to control the electronic system 1800. The memory 1830 may be used as an operating memory of the processor 1810. The processor 1810 and the RAM 1840 may be included in the semiconductor apparatuses according to embodiments of the inventive concepts. For example, in the semiconductor apparatus 1000 of FIG. 1, the logic chip 100 may include a processor 1810, and the memory chip 200 may include a RAM 1840. The memory 1830 may be provided to the outside of the semiconductor apparatus 1000 of FIG. 1, or may be included in the second memory chip 300 of FIG. 11.

Figure 20:
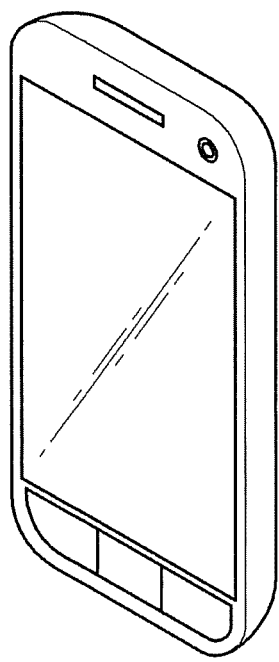
FIG. 20 is a diagram illustrating a mobile phone including a semiconductor apparatus according to an embodiment of the inventive concepts.

The semiconductor apparatuses of FIGS. 1 through 19 according to embodiments of the inventive concepts may be applied to various electronic devices. FIG. 20 is a diagram illustrating a mobile phone 1900 to which a semiconductor apparatus according to an embodiment of the inventive concepts is applied. Various embodiments of the inventive concepts can be applied to game consoles, portable notebooks, navigation devices, automobiles, and home appliances.

According to an embodiment of the inventive concepts, high-speed operation can be realized by separating a signal delivery path and a power delivery path of a logic chip and a memory chip.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor apparatus, comprising:
a base substrate;
a logic chip disposed on the base substrate, the logic chip including a memory control circuit, a first through silicon via, and a second through silicon via, the memory control circuit disposed on a first surface of a substrate of the logic chip and the memory control circuit being one of a plurality of circuits of the logic chip; and
a memory chip disposed on a second surface of the substrate of the logic chip, wherein
the first through silicon via electrically connects the memory control circuit and the memory chip,
the second through silicon via is electrically connected to the memory chip and configured to supply power to the memory chip,
the second through silicon via is electrically insulated from the first through silicon via and the plurality of circuits of the logic chip, and
the first surface of the substrate of the logic chip faces the base substrate.

2. The semiconductor apparatus of claim 1, wherein a plurality of conductive solder balls are disposed between the memory chip and the logic chip and between the logic chip and the base substrate.

3. The semiconductor apparatus of claim 2, wherein each conductive solder ball is disposed on respective conductive pads.

4. The semiconductor apparatus of claim 1, further comprising:
an interlayer dielectric layer disposed on the first surface of the substrate of the logic chip.

5. The semiconductor apparatus of claim 4, wherein at least an internal wiring is disposed in the interlayer dielectric layer configured to electrically connect the memory control circuit and a conductive pad having a conductive solder ball thereon.

6. The semiconductor apparatus of claim 1, wherein at least a redistribution line is disposed on the second surface of the substrate of the logic chip.

7. The semiconductor apparatus of claim 1, wherein an external input/output circuit, a micro input/output circuit, and an additional function circuit are disposed on the first surface of substrate of the logic chip.

8. The semiconductor apparatus of claim 1, wherein the base substrate comprises at least a circuit pattern therein.

9. The semiconductor apparatus of claim 1, wherein the first through silicon via is configured to supply a data signal and a control signal to the memory chip.

10. The semiconductor apparatus of claim 1, wherein the power comprises a power voltage (VDD) and a ground voltage (VSS).

11. The semiconductor apparatus of claim 1, wherein the logic chip comprises a mobile CPU.

12. The semiconductor apparatus of claim 1, wherein the memory chip comprises a wide I/O memory or a flash memory.

13. The semiconductor apparatus of claim 1, wherein a molding compound is disposed on the logic chip and the memory chip.

14. The semiconductor apparatus of claim 1, wherein the base substrate comprises a printed circuit board (PCB).

15. The semiconductor apparatus of claim 1, further comprising:
an interposer disposed either between the logic chip and the base substrate or between the logic chip and the memory chip.

16. The semiconductor apparatus of claim 1, further comprising:
an additional memory chip disposed between the logic chip and the memory chip, the additional memory chip comprising at least one through silicon via.

17. The semiconductor apparatus of claim 1, further comprising:
a third through silicon via immediately adjacent to the first through silicon via and electrically connected to the first through silicon via.

18. The semiconductor apparatus of claim 17, further comprising:
a fourth through silicon via immediately adjacent to the second through silicon via and electrically connected to the second through silicon via.

19. The semiconductor apparatus of claim 1, wherein the first through silicon via comprises a conductive connection surrounded by a via insulation layer.

20. The semiconductor apparatus of claim 1, wherein
the logic chip has first and second surfaces;
a first end of the first through silicon via and the second through silicon via penetrates the first surface of the substrate of the logic chip, the first end of the first through silicon via is electrically connected to the memory control circuit and the first end of the second through silicon via is electrically connected to the base substrate,
a second end of the first through silicon via and the second through silicon via penetrates a second surface of the substrate and is electrically connected to conductive pads disposed on the second surface of the logic chip;
the memory chip is electrically connected to the conductive pads disposed on the second surface of the logic chip; and
the second through silicon via is configured to supply the power to the memory chip via the base substrate without passing through memory control circuit.

21. The semiconductor apparatus of claim 1, wherein the memory control circuit is configured to generate signals to control the memory chip that are transmitted via the first through silicon via.

22. An arrangement of semiconductor chips, the arrangement comprising:
a base substrate;
a logic chip disposed on the base substrate, the logic chip including a memory control circuit, a first through silicon via and a second through silicon via, the memory control circuit disposed on a first surface of a substrate of the logic chip; and
a memory chip disposed on a second surface of the substrate of the logic chip, wherein
a signal between the logic chip and the memory chip transmits through a first path,
a power for the memory chip transmits through a second path, the first path is electrically insulated from the second path, and the first surface of the substrate of the logic chip faces the base substrate,
the first path includes the first through silicon via, a micro input/output circuit, the memory control circuit, and an external input/output circuit, and
the second path includes the second through silicon via; wherein the second through silicon via is electrically insulated from the memory control circuit.

23. A semiconductor apparatus, comprising:
a base substrate;
a logic chip disposed on the base substrate, the logic chip including a memory control circuit, an input/output (I/O) circuit, a first through silicon via and a second through silicon via, the memory control circuit disposed on a first surface of a substrate of the logic chip; and
a memory chip disposed on a second surface of the substrate of the logic chip, wherein the first through silicon via is configured to transmit signals from the memory control circuit to the memory chip via channels of the I/O circuit,
the second through silicon via is configured to transmit power from the base substrate to the memory chip via channels included in the I/O circuit, and
the channels are configured to transmit a data signal, a control signal, power voltage (Vdd), and ground voltage (Vss); wherein the second through silicon via is electrically insulated from the memory control circuit.

24. A semiconductor apparatus, comprising:
a base substrate;
a logic chip disposed on the base substrate, the logic chip including a plurality of circuits whereby the plurality of circuits comprises at least one memory control circuit and a plurality of through silicon vias including a first through silicon via and a second through silicon via; and
a memory chip stacked on the logic chip in a first direction, the plurality of through silicon vias oriented in the first direction, wherein
the memory chip overlaps the plurality of through silicon vias, the plurality of circuits do not overlap the plurality of through silicon vias, and the memory chip overlaps at least one circuit,
the first through silicon via is configured to transmit signals from at least one of the plurality of circuits to the memory chip, and
the second through silicon via is configured to transmit power to the memory chip and is electrically insulated from the plurality of circuits of the logic chip.

25. A semiconductor module, comprising:
a PCB substrate including a plurality of circuit patterns disposed thereon and a plurality of external device terminals disposed at respective ends of the circuit patterns; and
a semiconductor apparatus disposed on and electrically connected to the PCB substrate through the plurality of circuit patterns, the semiconductor apparatus including,
a logic chip including a memory control circuit, a first through silicon via and a second through silicon via, and
a memory chip disposed on the logic chip, the second through silicon vias configured to transmit power to the memory chip and the first through silicon via configured to transmit signals to the memory chip; wherein
the external device terminals are configured to receive signals other than a memory control signal; wherein the second through silicon via is electrically insulated from the memory control circuit.

26. The semiconductor module of claim 25, wherein the external device terminals are configured to receive at least one of a logic signal, a logic power, or a memory power.

* * * * *